United States Patent
Hashimoto

(10) Patent No.: US 7,633,099 B2
(45) Date of Patent: Dec. 15, 2009

(54) FIELD-EFFECT TRANSISTOR COMPRISING HOLLOW CAVITY

(75) Inventor: Shingo Hashimoto, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/378,414

(22) Filed: Mar. 20, 2006

(65) Prior Publication Data
US 2006/0220108 A1    Oct. 5, 2006

(30) Foreign Application Priority Data
Mar. 29, 2005  (JP)  ............... 2005-095054

(51) Int. Cl.
*H01L 29/80* (2006.01)
(52) U.S. Cl. ............... 257/213; 257/E29.257; 257/E29.201; 257/330; 257/E29.255
(58) Field of Classification Search ............ 257/213, 257/E29.229, E29.255, 330, E29.257, E29.201
See application file for complete search history.

(56) References Cited

U.S. PATENT DOCUMENTS

| | | | |
|---|---|---|---|
| 4,926,225 A * | 5/1990 | Hosack | 257/225 |
| 6,232,202 B1 * | 5/2001 | Hong | 438/424 |
| 6,285,057 B1 * | 9/2001 | Hopper et al. | 257/330 |
| 6,544,833 B2 | 4/2003 | Kawakubo | |
| 6,570,217 B1 * | 5/2003 | Sato et al. | 257/327 |
| 6,727,186 B1 * | 4/2004 | Skotnicki et al. | 438/734 |
| 6,743,654 B2 * | 6/2004 | Coffa et al. | 438/52 |
| 2005/0157571 A1 * | 7/2005 | Schaffer | 365/200 |

FOREIGN PATENT DOCUMENTS

| | | |
|---|---|---|
| JP | 5-198817 | 8/1993 |
| JP | 2000-012547 A | 4/2000 |
| JP | 2002-026279 A | 1/2002 |

OTHER PUBLICATIONS

T. Sato et al., "SON (Silicon on Nothing) MOSFET using ESS (Empty Space in Silicon) technique for SoC applications," IEEE, IEDM 01-809, 37.1.1-37.1.4, 2001, 4 pp.

* cited by examiner

*Primary Examiner*—Bradley K Smith
*Assistant Examiner*—Mohammad T Karimy
(74) *Attorney, Agent, or Firm*—Foley & Lardner LLP

(57) ABSTRACT

A field-effect transistor has: a substrate having a first cavity; a gate electrode buried in the substrate; and diffusion layers formed in the substrate and being in contact with the first cavity. A channel region is formed substantially perpendicular to a surface of the substrate between the diffusion layers.

20 Claims, 23 Drawing Sheets

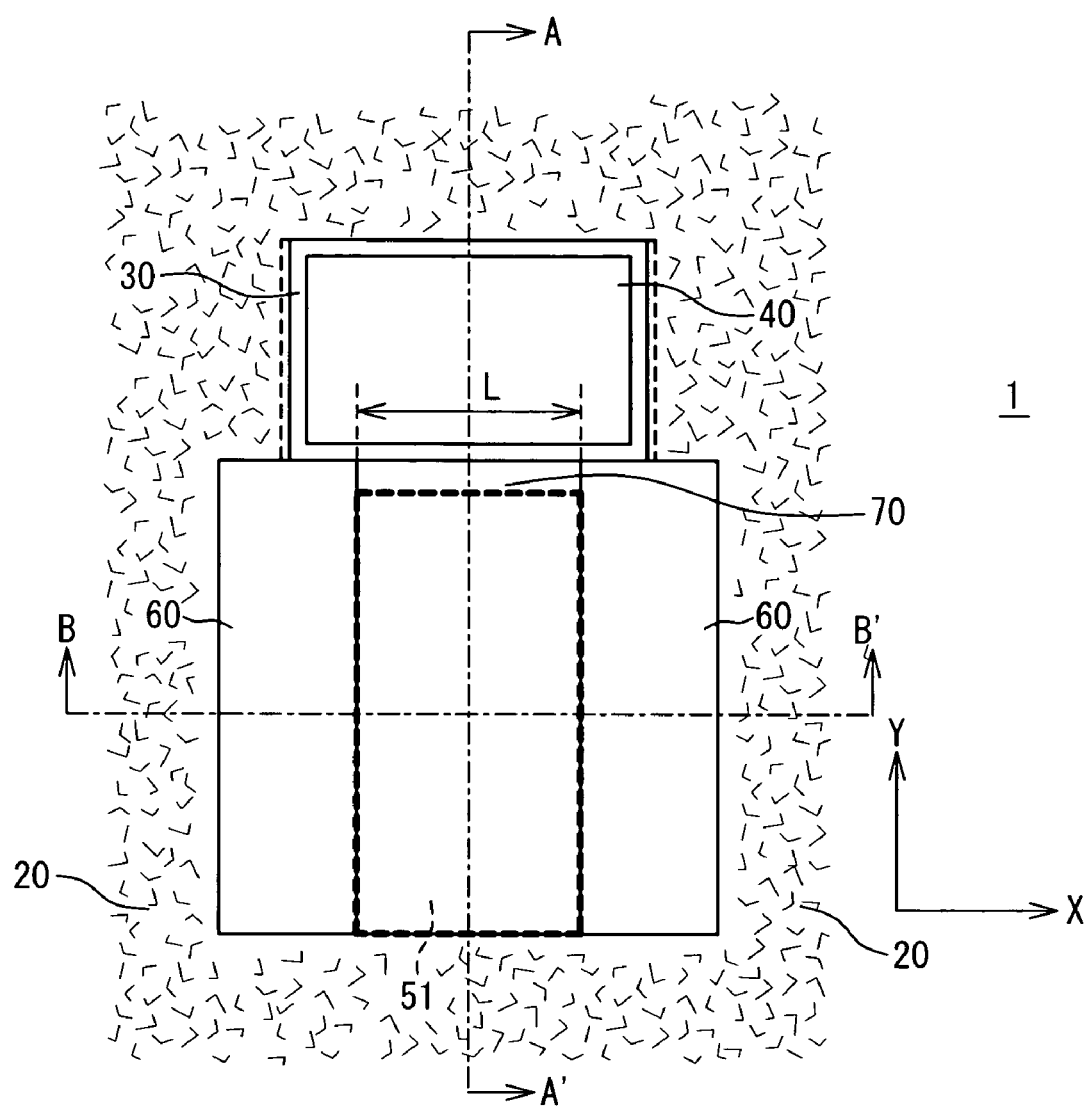

SEMICONDUCTOR DEVICE 100

SEMICONDUCTOR DEVICE 100

150 SRAM

FIELD-EFFECT TRANSISTOR COMPRISING HOLLOW CAVITY

BACKGROUND OF THE INVENTION

1. Field of the Invention

The present invention relates to a transistor technology. In particular, the present invention relates to a field-effect transistor, a method of manufacturing the same, a semiconductor device and a semiconductor memory device having the field-effect transistor.

2. Description of the Related Art

Incident radiation (cosmic ray, thermal neutron, α-ray and so on) into a semiconductor memory device generates electron-hole pairs due to collision with a silicon substrate. The generated electron-hole pairs are collected in a diffusion layer, which causes a change in potential at a node. What most contributes to the potential change at the node is funneling immediately under a drain region among charge collection mechanisms. A phenomenon that a memory cell data is rewritten due to the potential change at the node is called a "soft error". With the advance of miniaturization of a device in recent years, the influence of electrons and holes caused by the radiation becomes more conspicuous.

Japanese Laid Open Patent Application JP-P2000-12547A discloses a technique whose object is to enhance resistance to a single event upset (the soft error). According to a semiconductor device disclosed in the patent document, a high-density defect layer is formed in a source region and a region immediately under a drain depletion layer below a drain region. The high-density defect layer functions as a recombination center and facilitates recombination of minority carriers.

As a general technique, a vertical field-effect transistor is disclosed in Japanese Laid Open Patent Application JP-A-Heisei 5-198817 and Japanese Laid Open Patent Application JP-P2002-26279A. In the vertical field-effect transistor, a moving direction of carriers (a conduction direction) is perpendicular to a surface of a substrate.

A document; T. Sato et al., "SON (Silicon on Nothing) MOSFET using ESS (Empty Space in Silicon) technique for SoC applications", IEEE, IEDM 01-809, 37.1.1-37.1.4, 2001, discloses a SON (Silicon on Nothing) MOS transistor whose object is to improve performance. The SON-MOS transistor is manufactured based on an ESS (Empty Space in Silicon) technique. According to the SON-MOS transistor disclosed in the document, a gate electrode is formed on a substrate and an ESS structure is formed below a channel region.

SUMMARY OF THE INVENTION

The electron-hole pairs are generated by the incident radiation into the substrate, which causes the soft error. A technique capable of improving the SER (Soft Error Rate) is desired.

In an aspect of the present invention, a field-effect transistor is provided with a substrate having a cavity, a gate electrode buried in the substrate, and diffusion layers formed in the substrate. A channel region is designed to be located at a side of the cavity and to be substantially perpendicular to a surface of the substrate. For that reason, the gate electrode is buried in the substrate, and a gate insulating film is provided between the gate electrode and the channel region. The diffusion layers are formed in the substrate to be connected with the channel region. The diffusion layers may be in contact with the cavity. As described above, the gate electrode and the diffusion layers are formed to surround the cavity in a plane parallel to the substrate surface.

In the device thus constructed, the substrate which is the source of the electron-hole pairs inducing the soft error is almost eliminated from the periphery of the channel region. The source of the electron-hole pairs is substantially isolated from the diffusion layers and the channel region. Therefore, occurrence of the soft error is greatly suppressed and hence the SER is improved. In particular, the miniaturization of a device is progressing in recent years, and the present invention brings about an excellent effect.

Moreover, the channel region is formed to be substantially perpendicular to the substrate surface, while a moving direction of carriers (conductive direction) is substantially parallel to the substrate surface. That is to say, the gate width W is defined as a length in a depth direction vertical to the substrate surface. A sufficient gate width W can be secured in the depth direction. As a result, areas of the diffusion layers and the gate electrode viewed from the above can be designed to be minimum necessary. It is thus possible to reduce an area of a semiconductor device having the field-effect transistor according to the present invention.

In another aspect of the present invention, a method of manufacturing a field-effect transistor is provided. The method includes: (A) forming a device isolation region in a substrate; (B) forming a trench in a first region of the substrate; (C) forming a gate insulating film on an inner wall of the trench; (D) forming a gate electrode buried in the trench and projecting upward from a surface of the substrate; (E) forming a sidewall surrounding the projected portion of the gate electrode; (F) forming a first cavity by etching a second region adjacent to the sidewall; (G) forming diffusion layers in a third region of the substrate such that the diffusion layers are adjacent to the first cavity; and (H) forming a second cavity which is continuous with the first cavity and extends under the third region.

According to the field-effect transistor and the semiconductor device of the present invention, the resistance to the soft error is improved. It is also possible to reduce the area of the semiconductor device.

BRIEF DESCRIPTION OF THE DRAWINGS

The above and other objects, advantages and features of the present invention will be more apparent from the following description taken in conjunction with the accompanying drawings, in which:

FIG. 2 is a plan view showing a structure of the field-effect transistor according to the first embodiment;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment (Structure)

Figure 1:
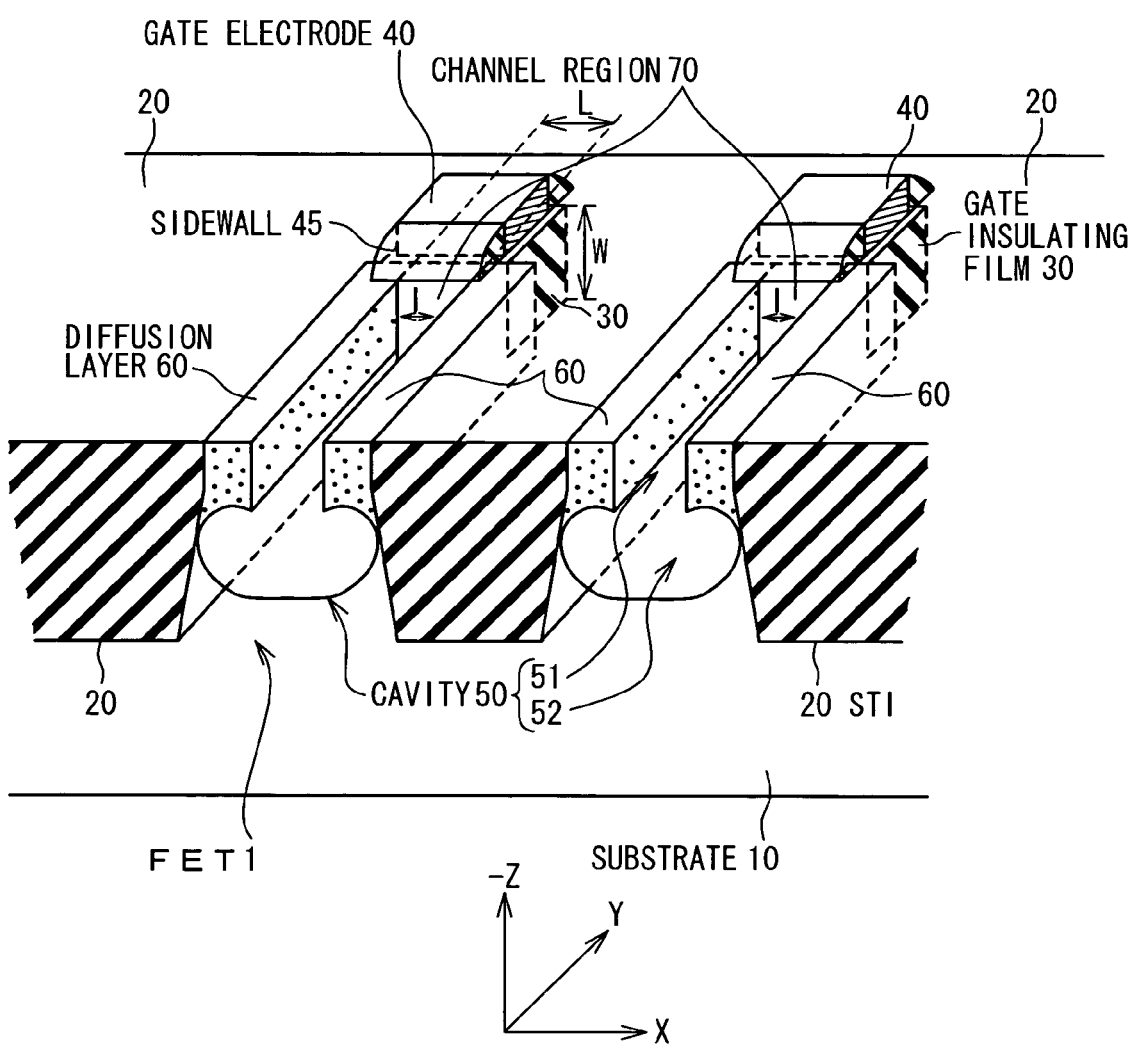
FIG. 1 is an overall view showing a structure of a field-effect transistor according to a first embodiment of the present invention.

FIG. 1 is an overall view showing a structure of a field-effect transistor according to a first embodiment. In FIG. 1, a Z-direction (a depth direction) is defined as a direction perpendicular to a surface of a substrate 10. An X-direction and a Y-direction are defined as two directions which are perpendicular to the Z-direction and are orthogonal to each other. That is, a plane parallel to the surface of the substrate 10 is expressed as an XY-plane.

In FIG. 1, the substrate 10 is provided with an STI 20 which is a device isolation structure (device isolation region) for isolating a device region from another. A field-effect transistor 1 is formed in the device region surrounded by the STIs 20. The field-effect transistor 1 has a gate insulating film 30, a gate electrode 40, and a diffusion layer (source and drain) 60.

In the present embodiment, the gate insulating film 30 and at least a part of the gate electrode 40 are buried in the substrate 10. The gate insulating film 30 and the gate electrode 40 are formed to reach at least the same depth as the diffusion layer 60. Moreover, the gate insulating film 30 and the gate electrode 40 are located in the Y-direction viewed from the diffusion layer 60. In such a configuration, a channel region 70 where a channel occurs is formed in an XZ-plane substantially perpendicular to the surface of the substrate 10. A conduction direction (a moving direction of carriers) is along the X-direction substantially parallel to the surface of the substrate 10. To put it the other way around, the gate electrode 40, the gate insulating film 30 and the diffusion layer 60 are arranged such that the channel region 70 is formed in the above-described manner. Thus, a gate width W is defined as a depth of the gate electrode 40 along the Z-direction vertical to the substrate 10, instead of a length along the Y-direction parallel to the surface of the substrate 10. A gate length L is defined as a length of the channel region 70 along the X-direction.

Moreover, according to the present embodiment, a cavity 50 is formed in the substrate 10 of the device region. The cavity 50 includes a first cavity 51 and a second cavity 52. The first cavity 51 is formed to be sandwiched between the diffusion layers 60 (the source and the drain) and to reach the surface of the substrate 10. The second cavity 52 is continuous with the first cavity 51 and extends under the diffusion layers 60. In FIG. 1, the second cavity 52 is in contact with bottoms of the diffusion layers 60.

FIG. 2 is a plan view showing a structure of the field-effect transistor 1. In particular, shown in FIG. 2 is an arrangement of the STI 20, the gate insulating film 30, the gate electrode 40, the first cavity 51, the diffusion layer 60 and the channel region 70 in the XY-plane parallel to the surface of the substrate 10. According to the present embodiment, the gate insulating film 30, the gate electrode 40 and the diffusion layers 60 are formed to surround the first cavity 51 in the XY-plane. For example, in FIG. 2, the gate insulating film 30, the gate electrode 40 and the diffusion layers 60 are arranged in an inversed U-shape to surround the first cavity 51 in the XY-plane.

More specifically, the channel region 70 is located on a side (Y-direction) of the first cavity 51. Further in the Y-direction from the channel region 70, the gate electrode 40 is formed through the gate insulating film 30. Thus, the gate electrode 40 is provided away from the first cavity 51. The channel region 70 is sandwiched between the gate insulating film 30 and the first cavity 51 in the XY-plane parallel to the surface of the substrate 10. It should be noted that the gate insulating film 30 is formed to surround all side surfaces of the gate electrode 40 in FIG. 2.

The diffusion layers 60 are located on sides (X-direction) of the first cavity 51 and face each other. It is preferable that the diffusion layers 60 are formed adjacent to the first cavity 51 and in contact with the first cavity 51. Since the diffusion layer 60 holding charges is not in contact with the substrate 10, holes and electrons generated in the substrate 10 do not reach the diffusion layers 60 and hence the funneling does not occur, which greatly reduces occurrence of the soft errors. Also, the diffusion layers 60 are formed adjacent to the STI 20. Even if radiation enters the STI 20 and hole-electron pairs are generated, the generated hole-electron pairs do not jump over a band gap of the insulating film. In FIG. 2, one of the two diffusion layers 60 is a source and the other is a drain. That is, the first cavity 51 is sandwiched between the source and the drain which face each other. To put it the other way around, the source and the drain are formed to sandwich the first cavity 51 in the X-direction. The source and the drain thus configured are connected to the channel region 70. According to the present embodiment, a channel length is defined as a distance L in the X-direction between the source and the drain contacting the channel region 70.

Figure 3A:
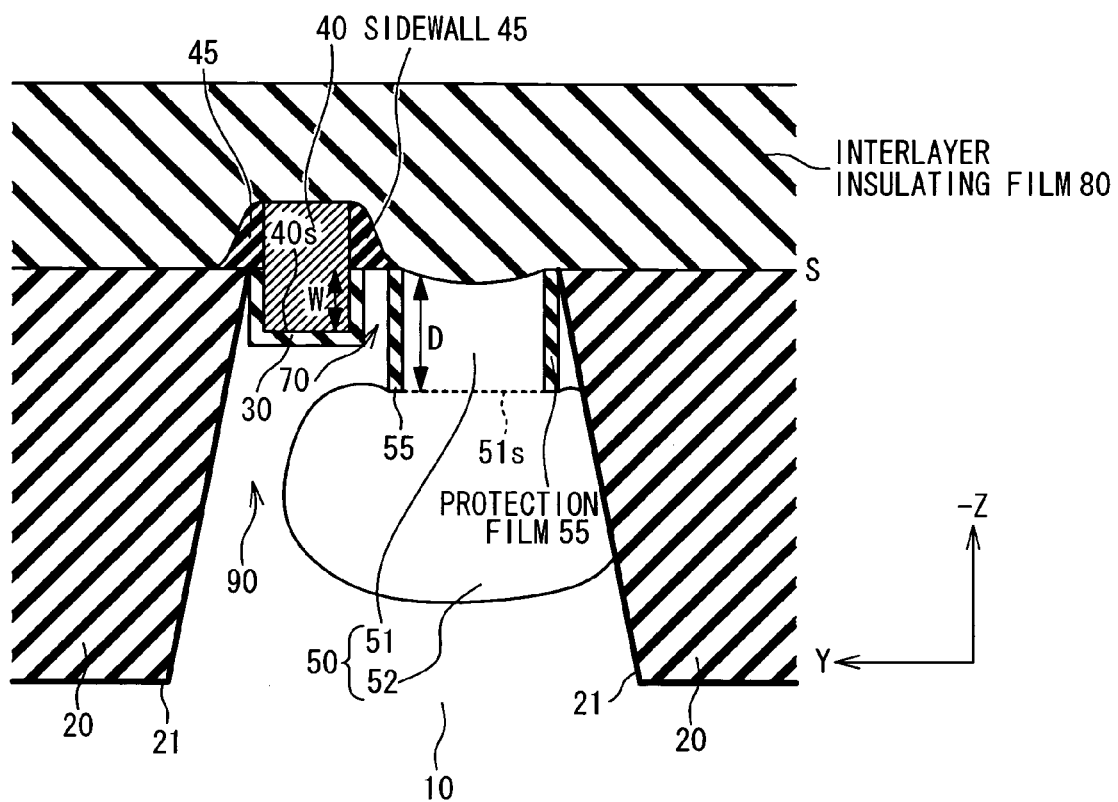
FIG. 3A is a cross sectional view showing a structure along a line A-A' in FIG. 2.
Figure 3B:
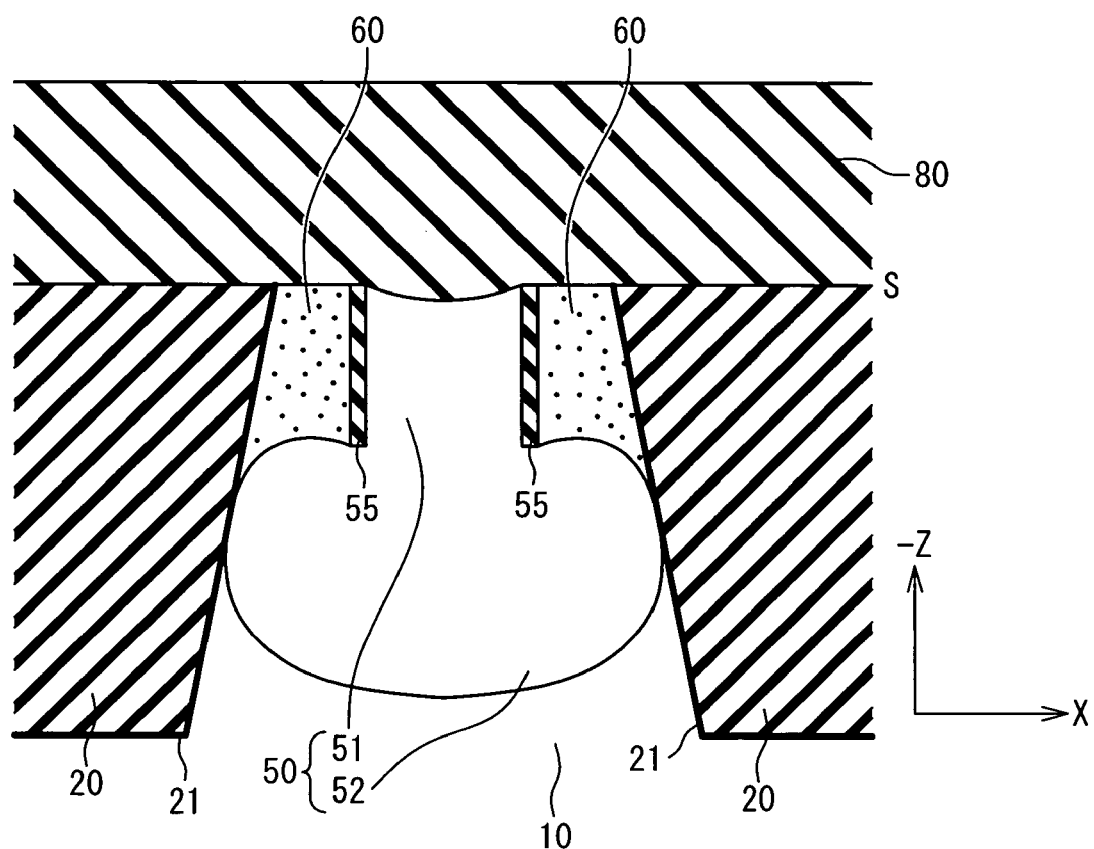
FIG. 3B is a cross sectional view showing a structure along a line B-B' in FIG. 2.

More detailed description is given on the structure of the field-effect transistor 1 according to the present embodiment. FIG. 3A is a cross sectional view taken along a line A-A' in FIG. 2, showing a structure of the field-effect transistor 1 in the YZ-plane. FIG. 3B is a cross sectional view taken along a line B-B' in FIG. 2, showing a structure of the field-effect transistor 1 in the XZ-plane.

As shown in FIG. 3A, the gate electrode 40 is formed in the device region sectioned by the STI 20. The gate electrode 40 has a "buried-gate structure". That is to say, a part of the gate electrode 40 is buried in the substrate 10, reaching down below the substrate surface S. According to the present embodiment, the gate width W is defined as the depth of the gate electrode 40, namely, a distance from the substrate surface S to a bottom surface 40s of the gate electrode 40.

Moreover, as shown in FIG. 3A, the gate electrode 40 is formed to project upward (-Z direction) from the substrate surface S. The projected portion of the gate electrode 40 is surrounded by sidewalls 45. The gate electrode 40 does not necessarily project upward from the substrate surface S. However, as described later, formation of the sidewall 45 makes it easy to form the cavity 50 and to secure the channel region 70. It is therefore preferable that only a part of the gate electrode 40 is buried in the substrate 10 and the sidewall 45 is formed on a side of the projected portion of the gate electrode 40.

The gate insulating film 30 is formed to cover side surfaces and a bottom surface of the gate electrode 40. The channel region 70 is formed on the -Y direction side of the gate electrode 40 through the gate insulating film 30. The channel region 70 is located below the sidewall 45.

Further, the cavity 50 is formed in the substrate 10 of the device region. The cavity 50 includes the first cavity 51 and the second cavity 52. The first cavity 51 is formed to extend almost vertically (Z-direction) from the substrate surface S. A protection film 55 is formed on a side surface of the first cavity 51. The channel region 70 is formed between the first cavity 51 (the protection film 55) and the gate electrode 40 (the gate insulating film 30). On the other hand, the second cavity 52 is formed to further extend from a bottom surface 51s of the first cavity 51.

According to the present embodiment, as shown in FIG. 3A, the first cavity 51 is formed deeper than the gate electrode 40. That is to say, the bottom surface 51s of the first cavity 51 is located deeper than the bottom surface 40s of the gate electrode 40. A depth D of the first cavity 51 from the substrate surface S is larger than the gate width W (i.e., D>W). Since the first cavity 51 can be formed downward along the vertical direction through an etching, it is easy to control the depth D. Moreover, as shown in FIG. 3A, the second cavity 52 is formed not to reach the STI 20 under the gate electrode 40, namely, the second cavity 52 is off from the STI 20 under the gate electrode 40. Consequently, a path 90 is secured at the substrate 10 between the second cavity 52 and the STI 20. In other words, due to the above-mentioned configuration, the channel region 70 is not completely isolated from a lower part of the substrate, and hence the path 90 through which carriers can pass can be secured. A slight electrical conduction between the channel region 70 and the lower part of the substrate can be obtained. Therefore, a secondary effect that the "floating body effect" is prevented can be expected. It should be noted that since it is effective in order to reduce the SER to reduce a contact area of the channel region 70 and the diffusion layer 60 as possible, the first cavity 51 may be formed such that the depth D is equal to or small than the gate width W. In that case however, the gate electrode 40 should be prevented from being damaged at a time when the second cavity 52 is formed. It is desirable that an etching protection film, for example, an insulating film of high dielectric constant such as a High-k insulating film is formed as the gate insulating film 30 around the gate electrode 40.

Further in FIG. 3A, an interlayer insulating film 80 is formed over the whole substrate surface S.

Next, as shown in FIG. 3B, the diffusion layers 60 (the source and the drain) are formed adjacent to the first cavity 51. Here, the source and the drain are formed at almost the same level in the depth direction. That is, the field-effect transistor 1 according to the present embodiment is not a so-called "vertical MOS transistor". The moving direction of carriers (conduction direction) is the X-direction. The source and the drain are formed to sandwich the first cavity 51 extending in the vertical direction (Z-direction) from the substrate surface S.

In FIG. 3B, the second cavity 52 is formed to be in contact with the bottom of the diffusion layers 60. Also, the second cavity 52 is formed to reach the STI 20 under the diffusion layers 60. That is, the STI 20 is exposed to the second cavity 52. As a result, the diffusion layers 60 are completely isolated from the lower part of the substrate below the diffusion layers 60. Thus, a region in the substrate 10 which is the source of the electron-hole pairs inducing the soft error is almost eliminated from the periphery of the channel region 70. Therefore, the occurrence of the soft errors is greatly suppressed and hence the SER is improved.

It should be noted that a thermal oxide film 21 is formed on an outermost wall of the STI 20 as shown in FIGS. 3A and 3B. In other words, a surface of the STI 20 is covered by the thermal oxide film 21. The reason is as follows. Generally, a device isolation structure is formed by filling up a trench with a film through a CVD (Chemical Vapor Deposition) method. Adhesiveness between a mere deposited film and the substrate 10 is not always good. For the purpose of improving the adhesiveness between the STI 20 and the substrate 10 where the diffusion layer 60 is formed, the thermal oxide film 21 is formed on the outermost wall of the STI 20. Consequently, the portion where the diffusion layer 60 is formed is prevented from falling off the wall and into the cavity 50.

Also, upper portions of the diffusion layers 60 and the gate electrode 40 may be silicided. That is, Schottky-junctions may be formed at the upper portions of the diffusion layers 60 and the gate electrode 40. In this case also, a substrate potential is fixed and the floating body effect can be suppressed.

An operation of the field-effect transistor 1 explained above is as follows. When the field-effect transistor 1 is of the N-type, a potential of 0.5 to 0.8 V is applied to the gate electrode 40 and the drain 60, for example. A potential of 0 V is applied to the source 60 and the substrate 10. Consequently, the channel region 70 is formed in the XZ-plane perpendicular to the surface of the substrate 10, as stated above.

(Effect)

In the device thus constructed, a region of the substrate 10 which is the source of generating the electron-hole pairs inducing the soft errors is almost eliminated from the periphery of the channel region 70. The source of generating the electron-hole pairs is almost completely separated from the diffusion layers 60 and the channel region 70. Charge collection due to the funneling most contributes to the potential change at a node, while the silicon substrate is eliminated from the vicinity of the diffusion regions according to the present embodiment. Therefore, occurrence of soft errors is greatly suppressed and hence the SER is improved. In particular, the miniaturization of a device is progressing in recent years, and the present invention brings about an excellent effect. It should be noted in the present embodiment that only the first cavity 51 may be formed without the second cavity 52. Even in this case, it is possible to suppress the occurrence of soft errors to some extent.

Moreover, the channel region 70 is formed to be substantially perpendicular to the surface of the substrate 10. The gate width W corresponds to a width along the depth direction (Z-direction). A sufficient gate width W can be secured in the depth direction. As a result, it is possible to design the areas of the diffusion layers 60 and the gate electrode 40 in the XY-plane (seen from the above) as small as possible. Thus, the area of the field-effect transistor 1, namely, the area of the semiconductor device having the field-effect transistor 1 can be reduced.

Furthermore, the diffusion layer 60 is formed adjacent to the cavity 50. Therefore, a leak current is reduced. In addition, a diffusion layer capacitance is reduced, which increases speed of switching operations of the device.

(Method of Manufacturing)

FIGS. 4A to 4J show processes of manufacturing the field-effect transistor 1 according to the present embodiment. In each of FIGS. 4A to 4J, a left part shows a cross sectional view in the YZ-plane corresponding to FIG. 3A, while a right part shows a cross sectional view in the XZ-plane corresponding to FIG. 3B.

Figure 4A:
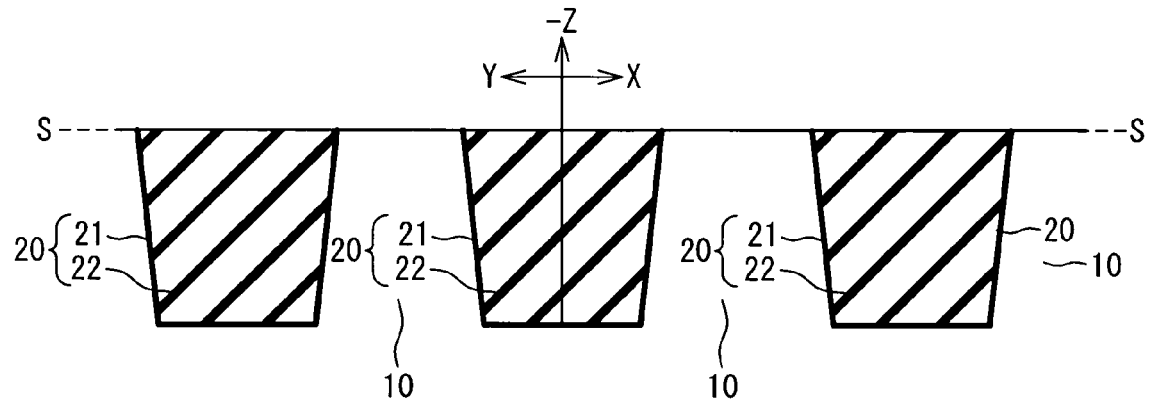
FIG. 4A is a cross sectional view showing a process of manufacturing the field-effect transistor according to the first embodiment.

First, as shown in FIG. 4A, the STI 20 as the device isolation structure is formed in a predetermined region of the substrate 10. More specifically, a thermal oxidization process is performed after a trench etching, and thus the thermal oxide film 21 is firstly formed on an inner wall of the trench. After that, a buried insulating film 22 is deposited in the trench through a CVD method. Consequently, the STI 20 is formed. The reason why the thermal oxide film 21 is formed is as follows. A film formed by a CVD method is a mere deposited film and has low adhesiveness. According to the present embodiment as stated above, the STI 20 is exposed to the cavity 50. Moreover, a portion where the diffusion layer 60 is formed is separated off from the lower part of the substrate and is attached to the STI 20. The portion where the diffusion layer 60 is formed is also exposed to the cavity 50. It is therefore necessary to enhance the adhesiveness between the STI 20 and a peripheral region to prevent the diffusion layer 60 or the STI 20 itself from falling off into the cavity 50. For that reason, the thermal oxide film 21 having high adhesiveness is formed as a "shell" of the device isolation structure.

Figure 4B:
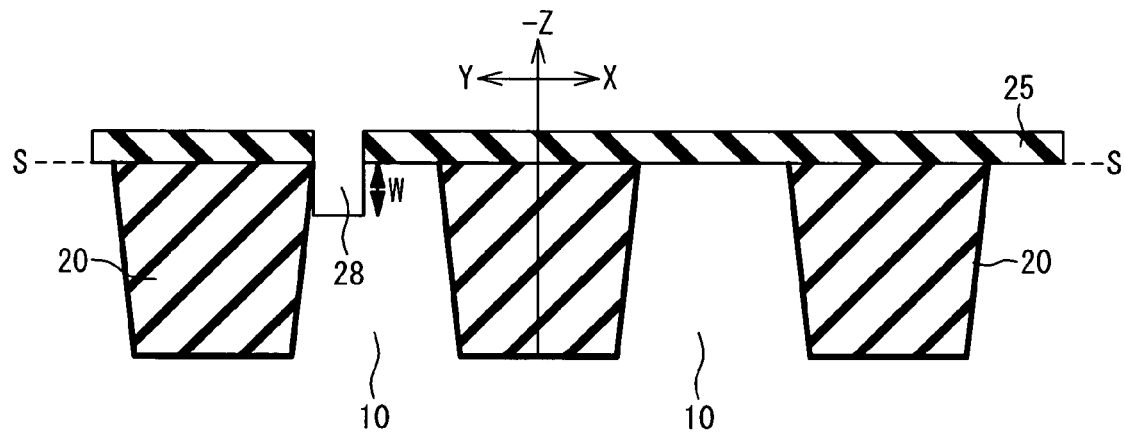
FIG. 4B is a cross sectional view showing a process of manufacturing the field-effect transistor according to the first embodiment.

Next, a nitride film 25 is deposited over a whole area through a CVD method. Subsequently, a dry etching is performed by the use of a predetermined mask with respect to the nitride film 25 and the substrate 10. Consequently, as shown in FIG. 4B, a trench 28 (a trench for forming a gate electrode) is formed next to the STI 20. A depth of the trench 28 from the substrate surface S is approximately the gate width W.

Figure 4C:
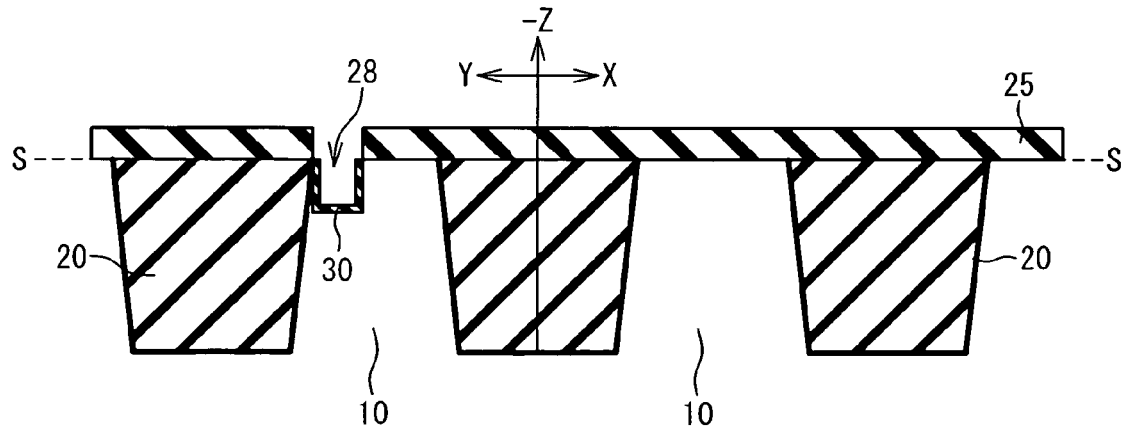
FIG. 4C is a cross sectional view showing a process of manufacturing the field-effect transistor according to the first embodiment.

Next, a thermal oxidization process is performed, and the gate insulating film 30 is formed on an inner wall of the trench 28, as shown in FIG. 4C. Generally, a thermal oxide film is not much formed on a nitride film. It is thus possible to selectively form in the trench 28 a thermal oxide film (gate insulating film 30) or a high dielectric constant film (e.g. nitride film).

Figure 4D:
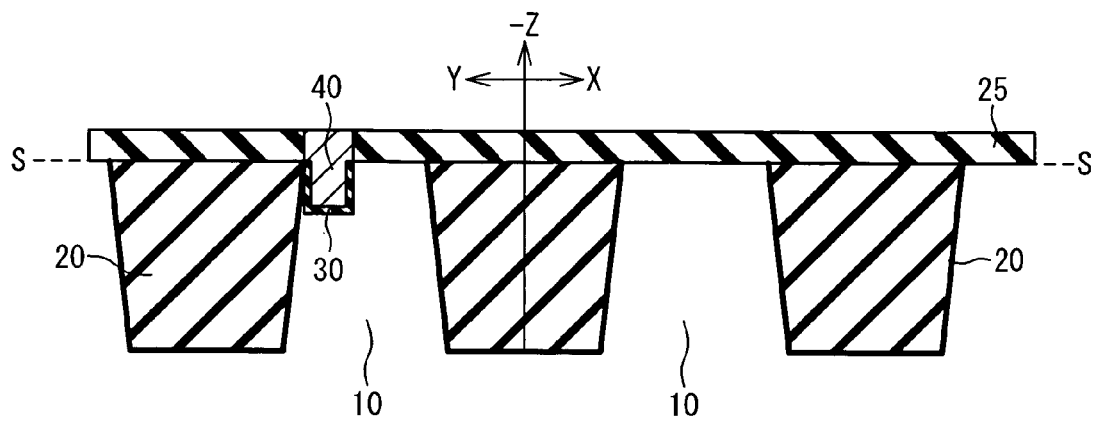
FIG. 4D is a cross sectional view showing a process of manufacturing the field-effect transistor according to the first embodiment.

Next, a polysilicon film is deposited over the whole area through the CVD method. Subsequently, a CMP (Chemical Mechanical Polishing) is carried out. Here, the nitride film 25 functions as a stopper. As a result, the gate electrode 40 is formed as shown in FIG. 4D. Due to the presence of the nitride film 25, the gate electrode 40 is formed to project upward from the substrate surface S. That is, a buried-gate structure can be obtained.

Figure 4E:
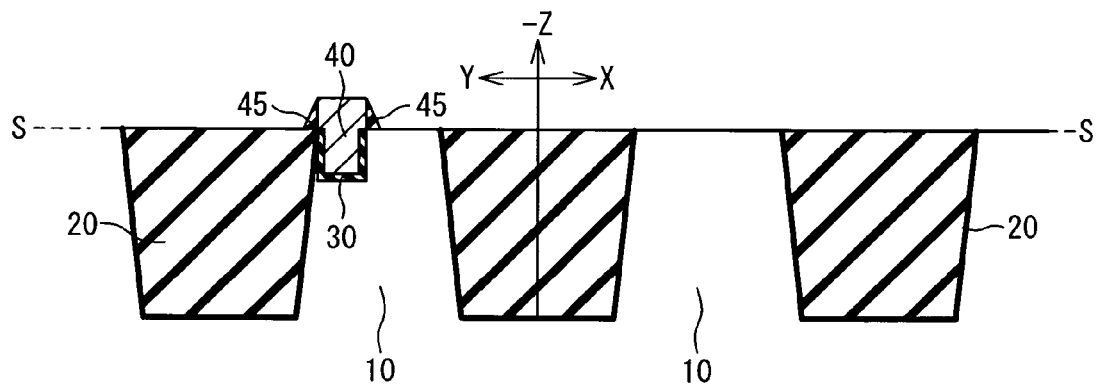
FIG. 4E is a cross sectional view showing a process of manufacturing the field-effect transistor according to the first embodiment.

Next, the nitride film 25 is once removed, and then another nitride film is deposited over the whole area. After that, an etchback process is performed. As a result, as shown in FIG. 4E, the sidewalls 45 are formed on both sides of the projected portion of the gate electrode 40 above the substrate surface S. The sidewall 45 is preferable for forming the channel region 70. That is, a substrate region under the sidewall 45 becomes the channel region 70.

Figure 4F:
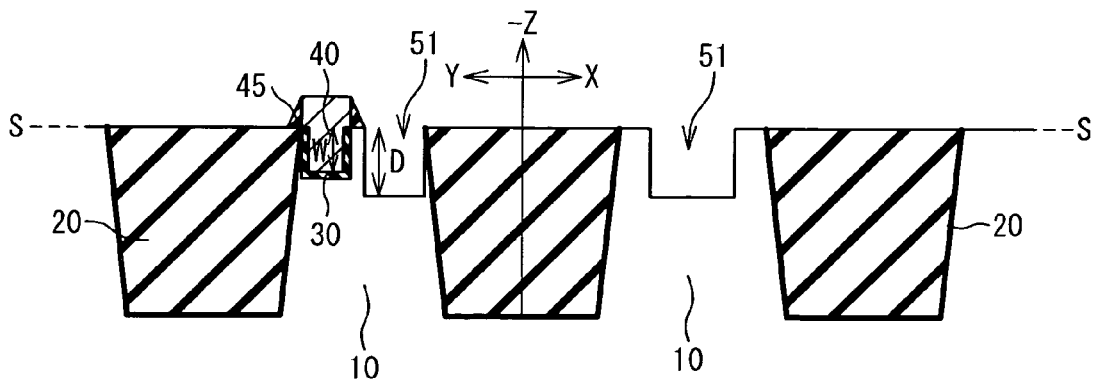
FIG. 4F is a cross sectional view showing a process of manufacturing the field-effect transistor according to the first embodiment.

Next, a region adjacent to the sidewall 45 is etched by using a resist mask. Consequently, as shown in FIG. 4F, the first cavity 51 is formed adjacent to the sidewall 45. Here, a substrate region where the diffusion layer 60 is formed (referred to as a diffusion layer formation region, hereinafter) is remained as shown in the right part of FIG. 4F (XZ-plane). In the present embodiment, the first cavity 51 is formed such that its depth D from the substrate surface S is larger than the depth W of the gate electrode 40 from the substrate surface S.

Figure 4G:
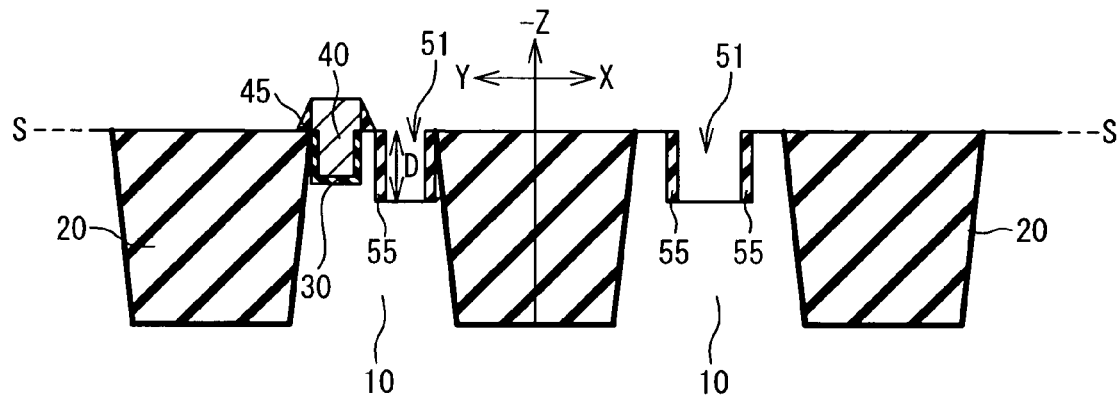
FIG. 4G is a cross sectional view showing a process of manufacturing the field-effect transistor according to the first embodiment.

Next, as shown in FIG. 4G, the protection film 55 is formed on a side surface of the first cavity 51 through an etchback process. The protection film 55 is an oxide film or a nitride film.

Figure 4H:
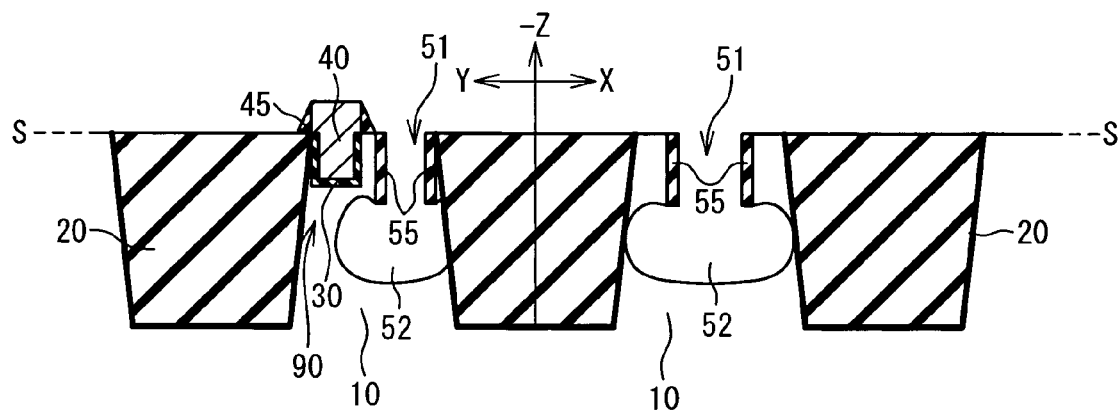
FIG. 4H is a cross sectional view showing a process of manufacturing the field-effect transistor according to the first embodiment.

Next, an isotropic etching is performed with respect to the substrate 10 such that the cavity further extends downward. As a result, the second cavity 52 which is continuous with the first cavity 51 is formed as shown in FIG. 4H. Here, the protection film 55 formed in the foregoing process prevents the sidewalls of the first cavity 51 from collapsing due to the isotropic etching. The second cavity 52 is formed not to reach the STI 20 under the gate electrode 40 (YZ-plane). As a result, the path 90 mentioned above is secured and thereby the floating body effect is suppressed. Additionally, the second cavity 52 is formed to reach the STI 20 under the diffusion layer formation region. Consequently, the diffusion layer formation region is separated off from the lower part of the substrate.

Figure 4I:
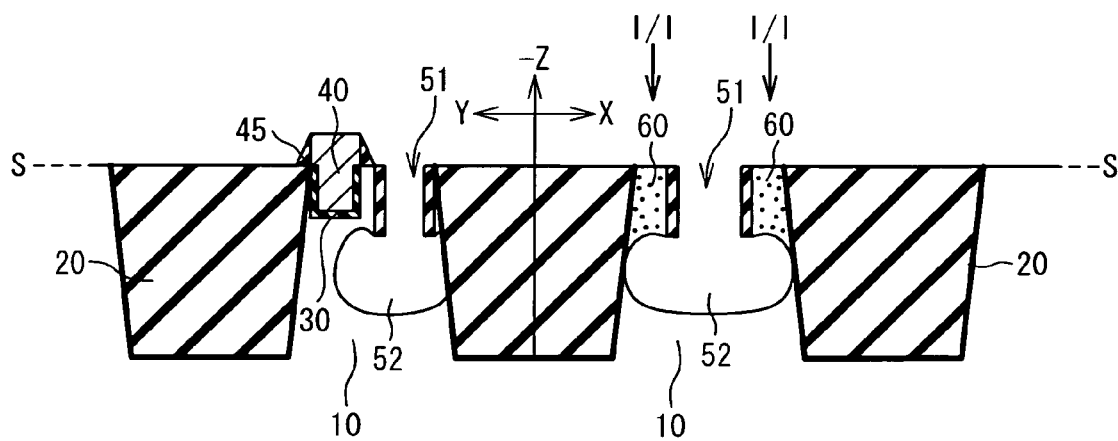
FIG. 4I is a cross sectional view showing a process of manufacturing the field-effect transistor according to the first embodiment.

Next, as shown in FIG. 4I, the diffusion layer 60 is formed by an ion implantation. The diffusion layer 60 is formed in the diffusion layer formation region that is adjacent to the first cavity 51 and is other than the channel region. After that, upper portions of the diffusion layer 60 and the gate electrode 40 may be silicided, and Schottky junctions may be formed thereon. It is preferable that impurity ions are implanted all over the diffusion layer formation region after the second cavity 52 is formed, as in the present embodiment. In this case, it is prevented that an unsolicited substrate remains under the formed diffusion layers 60. Thus, the occurrence of soft errors can be greatly reduced.

Figure 4J:
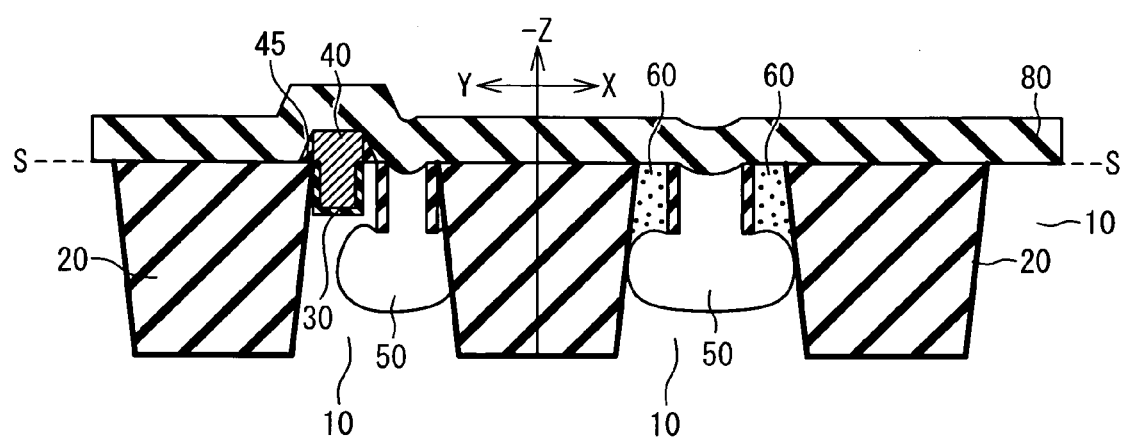
FIG. 4J is a cross sectional view showing a process of manufacturing the field-effect transistor according to the first embodiment.

Next, as shown in FIG. 4J, the interlayer insulating film 80 is deposited over the whole area. Here, a film of poor coverage may be deposited as the interlayer insulating film 80 such that the film does not adhere to the interior of the cavity 50.

By the combination of the processes described above, the field-effect transistor 1 of the present invention is manufactured. According to the field-effect transistor 1, the SER is improved, the area is reduced, and the leak current is reduced. It should be noted that the second cavity 52 may not be formed and only the first cavity 51 is formed. Even in that structure, it is possible to reduce the occurrence of soft errors to some extent.

Second Embodiment

Figure 5A:
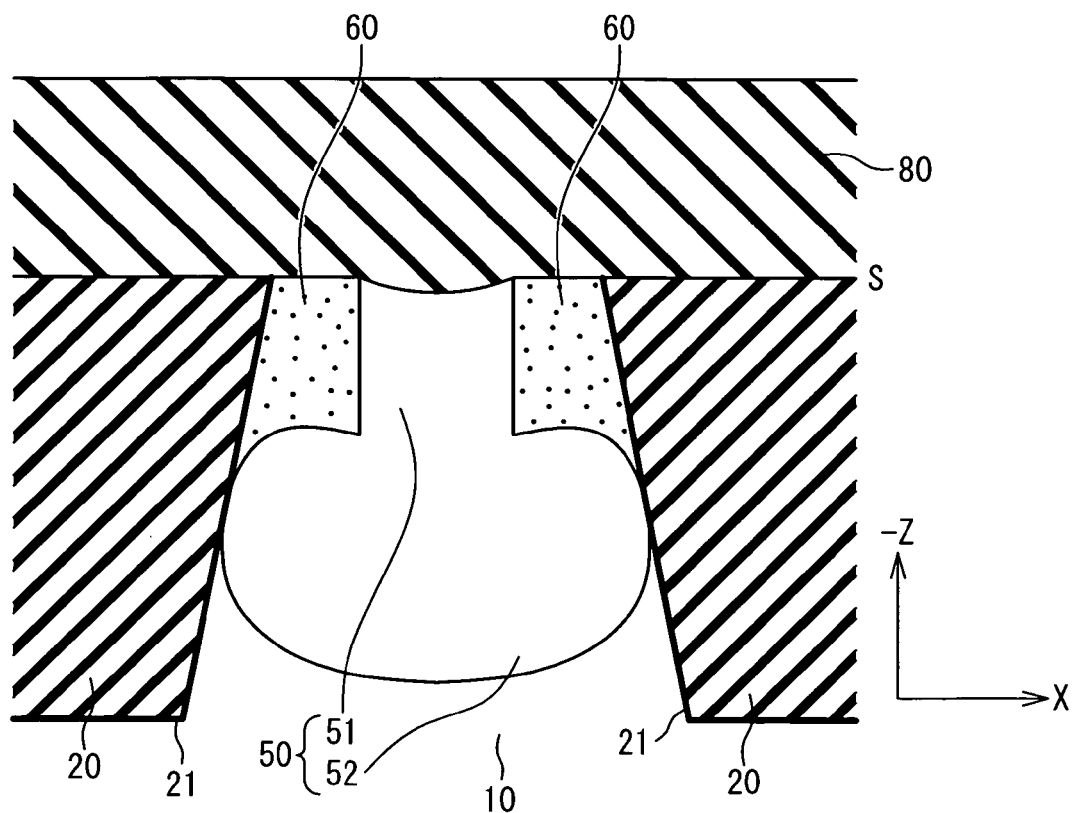
FIG. 5A is a cross sectional view showing a structure of a field-effect transistor according to a second embodiment of the present invention.
Figure 5B:
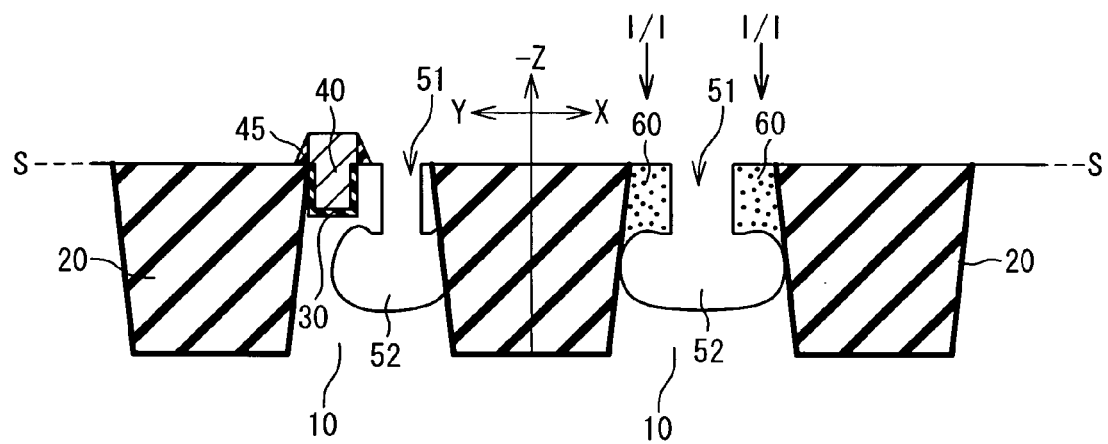
FIG. 5B is a cross sectional view showing a part of a process of manufacturing the field-effect transistor according to the second embodiment.

FIG. 5A is a cross sectional view showing a structure of a field-effect transistor according to a second embodiment of the present invention. FIG. 5A is a figure corresponding to FIG. 3B mentioned above, and shows a structure in the XZ-plane. In FIG. 5A, the same reference numeral as that in FIG. 3B is given to the same structure as that in FIG. 3B, and description thereof is appropriately omitted. FIG. 5B is a cross sectional view showing a part of processes of manufacturing the field-effect transistor according to the present embodiment. FIG. 5B is a figure corresponding to FIG. 4I mentioned above. In FIG. 5B, the same reference numeral as that in FIG. 4I is given to the same structure as that in FIG. 4I, and description thereof is appropriately omitted.

According to the present embodiment, a protection film 55 is not formed on the side wall of the first cavity 51. Not only a bottom surface but also a side surface of the diffusion layer 60 is exposed to the cavity 50. As a result, an amount of dielectrics between the source and the drain is reduced. Therefore, a coupling capacitance is reduced, and thereby such effects can be obtained that the transistor speed is increased and mutual interference is reduced. It should be understood that the effects that the SER is suppressed and the device area is reduced are also obtained, as in the case of the first embodiment.

Third Embodiment

Figure 6A:
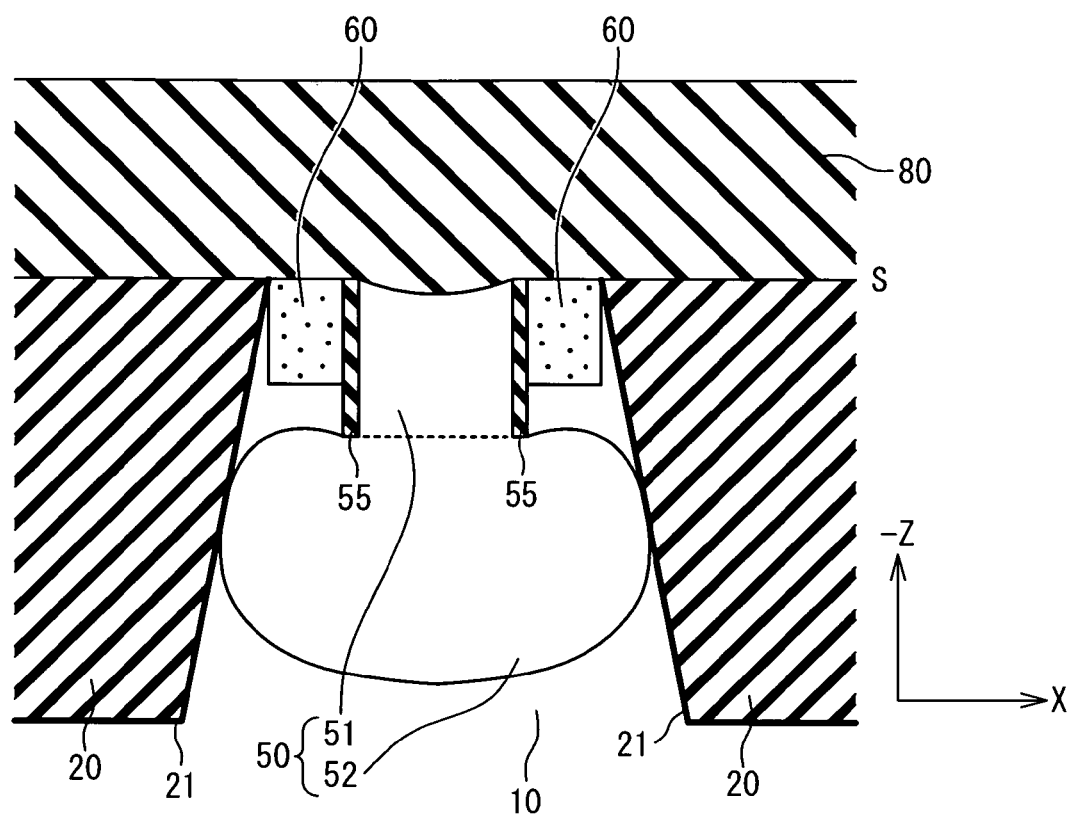
FIG. 6A is a cross sectional view showing a structure of a field-effect transistor according to a third embodiment of the present invention.
Figure 6B:
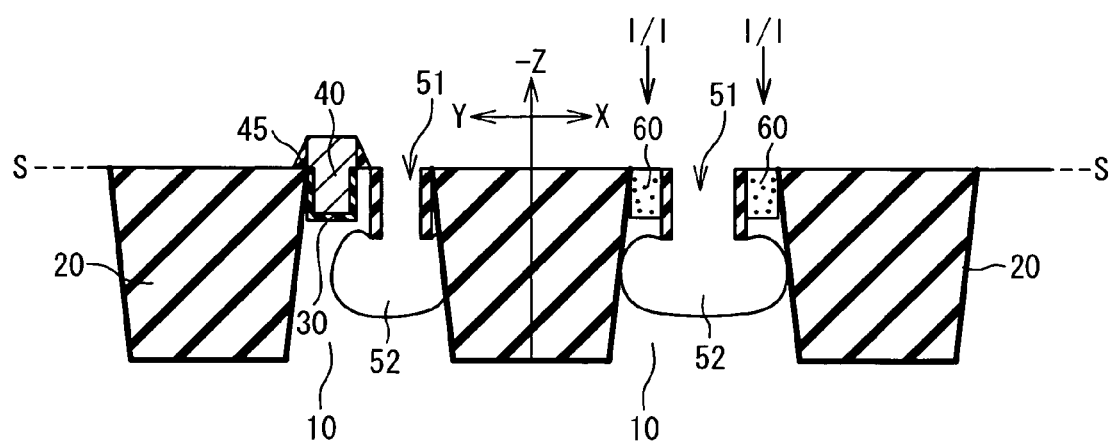
FIG. 6B is a cross sectional view showing a part of a process of manufacturing the field-effect transistor according to the third embodiment.

FIG. 6A is a cross sectional view showing a structure of a field-effect transistor according to a third embodiment of the present invention. FIG. 6A is a figure corresponding to FIG. 3B mentioned above, and shows a structure in the XZ-plane. In FIG. 6A, the same reference numeral as that in FIG. 3B is given to the same structure as that in FIG. 3B, and description thereof is appropriately omitted. FIG. 6B is a cross sectional view showing a part of processes of manufacturing the field-effect transistor according to the present embodiment. FIG. 6B is a figure corresponding to FIG. 4I mentioned above. In FIG. 6B, the same reference numeral as that in FIG. 4I is given to the same structure as that in FIG. 4I, and description thereof is appropriately omitted.

According to the present embodiment, a bottom surface of the diffusion layer 60 does not reach a second cavity 52. In other words, the diffusion layer 60 is formed in only a part of a region surrounded by the cavity 50, the STI 20 and the interlayer insulating film 80. For this reason, energy of the implanting ions is controlled in the ion implantation process shown in FIG. 6B. Alternatively, the diffusion layer 60 may be formed after the first cavity 51 is formed and before the second cavity 52 is formed. In this case, ions are prevented from being implanted into a bottom of the second cavity 52. Even with this structure, the SER is greatly suppressed as in the case of the first embodiment. In addition, the area of the field-effect transistor 1 is reduced. Furthermore, fine adjustment of a size (W dimension) of the field-effect transistor 1 in the depth direction is possible by controlling the ion implantation energy.

Fourth Embodiment

Figure 7:
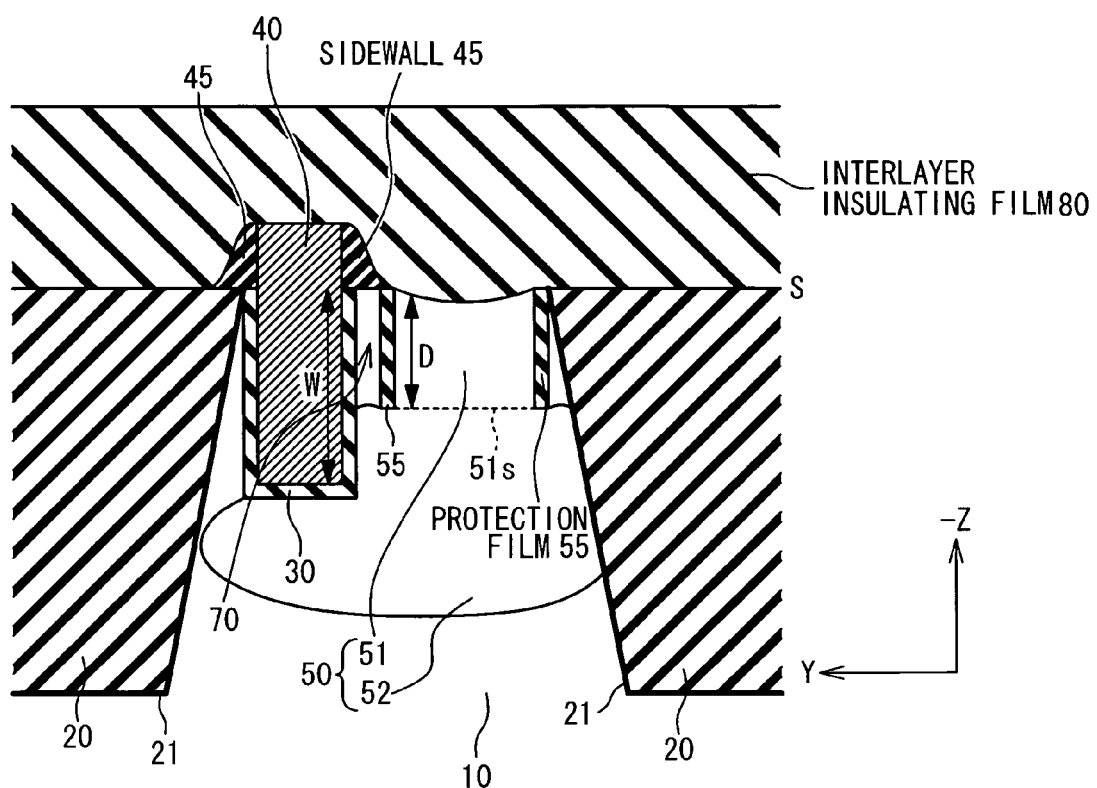
FIG. 7 is a cross sectional view showing a structure of a field-effect transistor according to a fourth embodiment of the present invention.

FIG. 7 is a cross sectional view showing a structure of a field-effect transistor according to a fourth embodiment of the present invention. FIG. 7 is a figure corresponding to FIG. 3A mentioned above, and shows a structure in the YZ-plane. In FIG. 7, the same reference numeral as that in FIG. 3A is given to the same structure as that in FIG. 3A, and description thereof is appropriately omitted.

In the present embodiment, as shown in FIG. 7, the gate electrode 40 is formed deeper than the first cavity 51. That is to say, a bottom surface of the gate electrode 40 is located deeper than the bottom surface 51s of the first cavity 51. The depth D of the first cavity 51 from the substrate surface S is equal to or smaller than the gate width W (D=, <W). In this case, the second cavity 52 is formed to reach the gate insulating film 30. Therefore, the diffusion layer 60 and the channel region 70 are completely isolated from the lower part of the substrate by the cavity 50 that complete insulates electricity. Since electrons or holes generated in the substrate 10 due to the entrance of the radiation are not supplied to the diffusion layer 60 and the channel region 70, it is possible to prevent the soft error almost completely. Consequently, the SER is reduced very effectively. It should be noted that the gate electrode 40 should be prevented from being damaged at a time when the second cavity 52 is formed. It is therefore preferable that an etching protection film, for example, an insulating film of high dielectric constant such as a High-k insulating film is formed as the gate insulating film 30 around the gate electrode 40. Furthermore, since the diffusion layer 60 is completely insulated electrically from the substrate 10 and a thyristor is not structured, occurrence of latchup can be prevented. This does not require complicated manufacturing processes such as hierarchization of wells to increase latchup resistance, for example. Additionally, the manufacturing method in the present embodiment is the same as the manufacturing method shown in the first embodiment.

Fifth Embodiment

According to the present invention, the gate insulating film 30, the gate electrode 40 and the diffusion layer 60 are formed to surround the first cavity 51 in the XY-plane parallel to the surface of the substrate 10. Layouts can be various, and are not limited to the one shown in FIG. 2. FIGS. 8A to 8D are plan views corresponding to FIG. 2, and show examples of the layouts in the XY-plane. In FIGS. 8A to 8D, the channel region 70 is located on the Y-direction side of the first cavity 51. Further in the Y-direction from the channel region 70, the gate electrode 40 is formed through the gate insulating film 30.

Figure 8A:
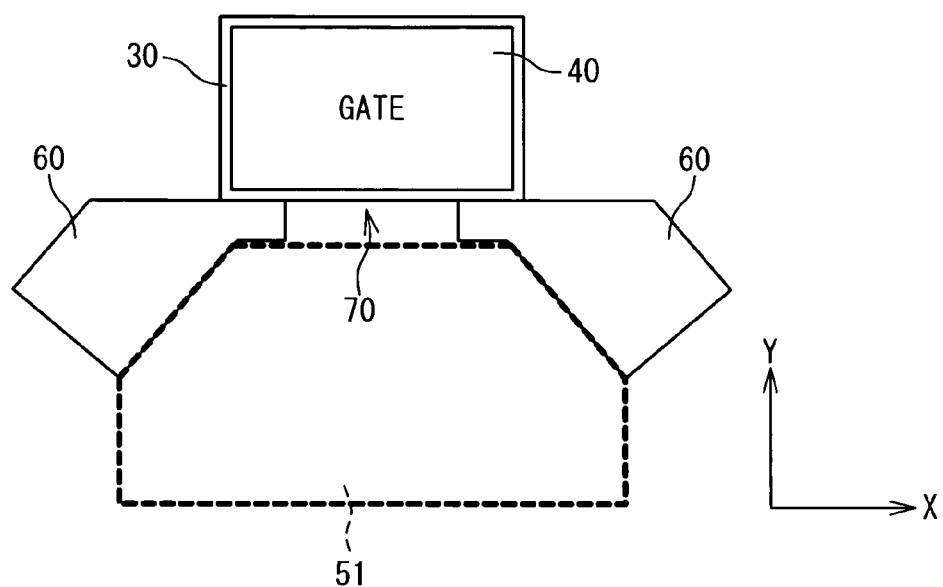
FIG. 8A is a plan view showing an example of a structure of a field-effect transistor according to a fifth embodiment of the present invention.

In FIG. 8A, the diffusion layers 60 (source and drain) are formed along three sides of the first cavity 51 and formed to sandwich the channel region 70. At the same time, the diffusion layer 60 is located in the X and Y-directions viewed from the first cavity 51. As compared with the layout shown in FIG. 2, the area of the diffusion layer 60 is reduced and the first cavity 51 is extended in the X-direction. As a result, it is possible to reduce the area of the device.

Figure 8B:
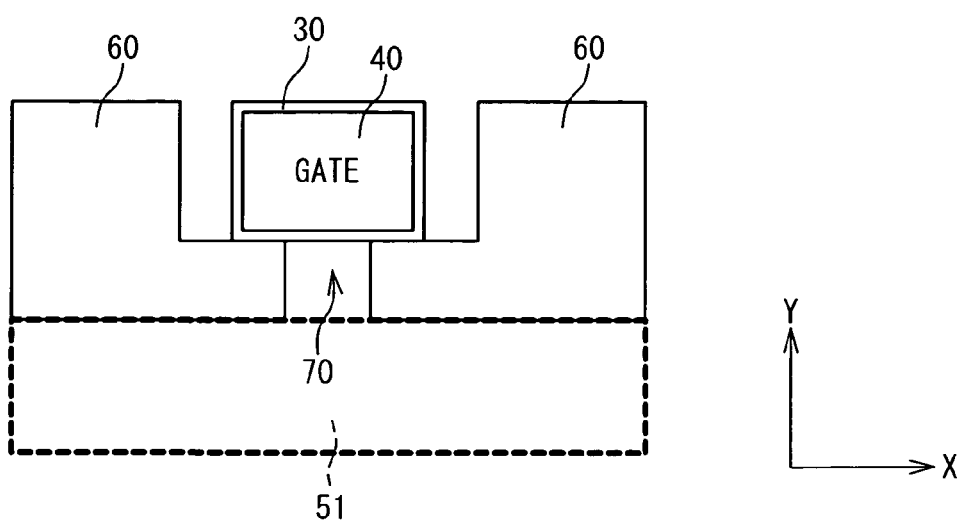
FIG. 8B is a plan view showing another example of the structure of the field-effect transistor according to the fifth embodiment of the present invention.

In FIG. 8B, not only the gate electrode 40 but also the diffusion layers 60 are located in the Y-direction viewed from the first cavity 51. The diffusion layers 60 are adjacent to the first cavity 51, while the gate electrode 40 is formed away from the first cavity 51. The channel region 70 is formed between the gate electrode 40 (gate insulating film 30) and the first cavity 51. A source and a drain, which are the diffusion layers 60, are formed to sandwich the channel region 70 along the X-direction. The source, the drain and the channel region 70 are formed along the same lateral side of the first cavity 51. At the same time, the source and the drain extend to periphery of the gate electrode 40. That is to say, the source and the drain are formed to sandwich the gate electrode 40 along the X direction, where the gate electrode 40 is located between the source and the drain. In this case, it is easy to form a contact connecting to the diffusion layer 60, since the diffusion layer 60 extends to both sides of the gate electrode 40. A protection film 55 may be provided between the first cavity 51 and the diffusion layer 60 or the channel region 70.

Figure 8C:
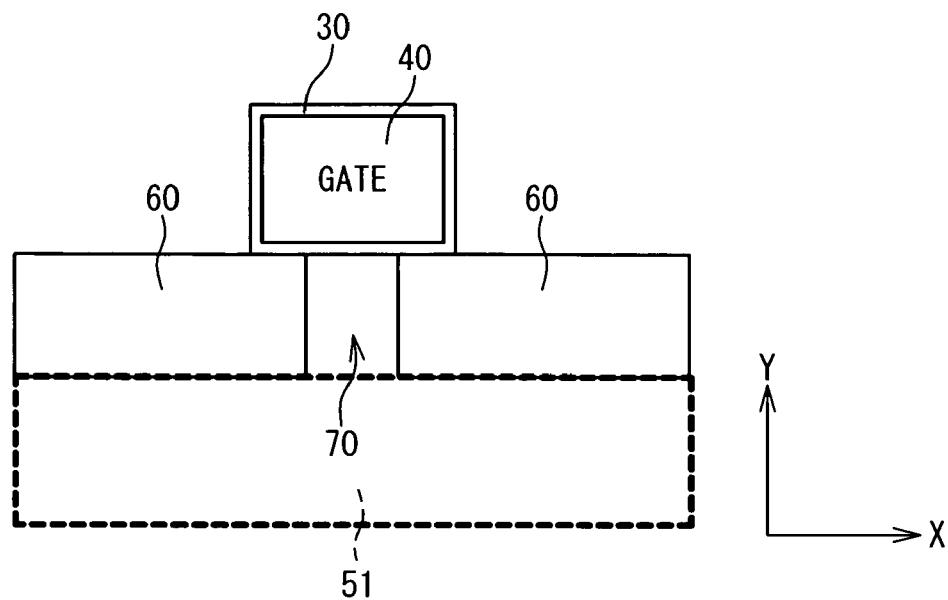
FIG. 8C is a plan view showing still another example of the structure of the field-effect transistor according to the fifth embodiment of the present invention.

In FIG. 8C also, the diffusion layers 60 and the channel region 70 are formed along the same lateral side of the first cavity 51. Also, the gate electrode 40 and the diffusion layers 60 are located in the Y-direction viewed from the first cavity 51. The diffusion layers 60 are adjacent to the first cavity 51, while the gate electrode 40 is formed away from the first cavity 51. The channel region 70 is formed between the gate electrode 40 (gate insulating film 30) and the first cavity 51. The source and the drain are formed to sandwich the channel region 70 along the X-direction. Here, the diffusion layers 60 do not extend to the both sides of the gate electrode 40. In this case, it is not necessary to generate complicated mask data, since the gate electrode 40, the first cavity 51 and the diffusion layer 60 all have rectangular shapes. Therefore, manufacturing becomes easier. Since at least one field-effect transistor can be formed on one side of the first cavity 51, the cavity can be shared by multiple field-effect transistors and a transistor area can be reduced.

Figure 8D:
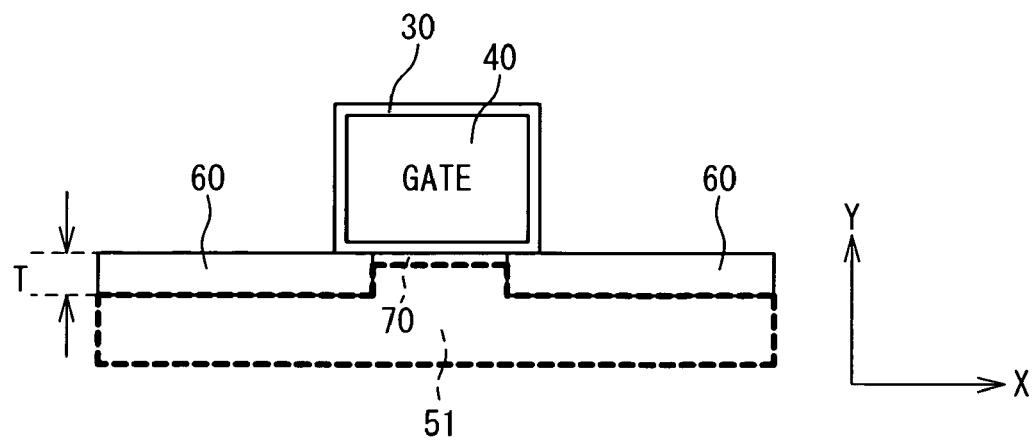
FIG. 8D is a plan view showing still another example of the structure of the field-effect transistor according to the fifth embodiment of the present invention.

In FIG. 8D, the gate electrode 40 and the diffusion layers 60 are located in the Y-direction viewed from the first cavity 51. At the same time, the diffusion layers 60 (source and drain) are formed to sandwich the first cavity 51 along the X-direction. The diffusion layers 60 are adjacent to the first cavity 51, the gate electrode 40 is formed away from the first cavity 51. In FIG. 8D, the diffusion layers 60 are in contact with the first cavity 51 at two sides. Also, the width of the channel region 70 in the Y-direction is made small to be a required minimum length as a channel. Consequently, it is possible to reduce a generation probability of holes and electrons generated in an Si region where the channel is not formed, which improves the soft error rate.

According to the present invention, the gate width W is the width in the depth direction (Z-direction), as described above. It is therefore possible to reduce the area of the diffusion layer 60 in the XY-plane as much as possible. For example, a width T of the diffusion layer 60 shown in FIG. 8D can be a necessary minimum. For example, the width T of the diffusion layer 60 in the XY-plane is set to approximately a channel thickness. As a result, it is possible to reduce the area of the field-effect transistor 1, namely, the area of the semiconductor device.

Sixth Embodiment

Figure 9:
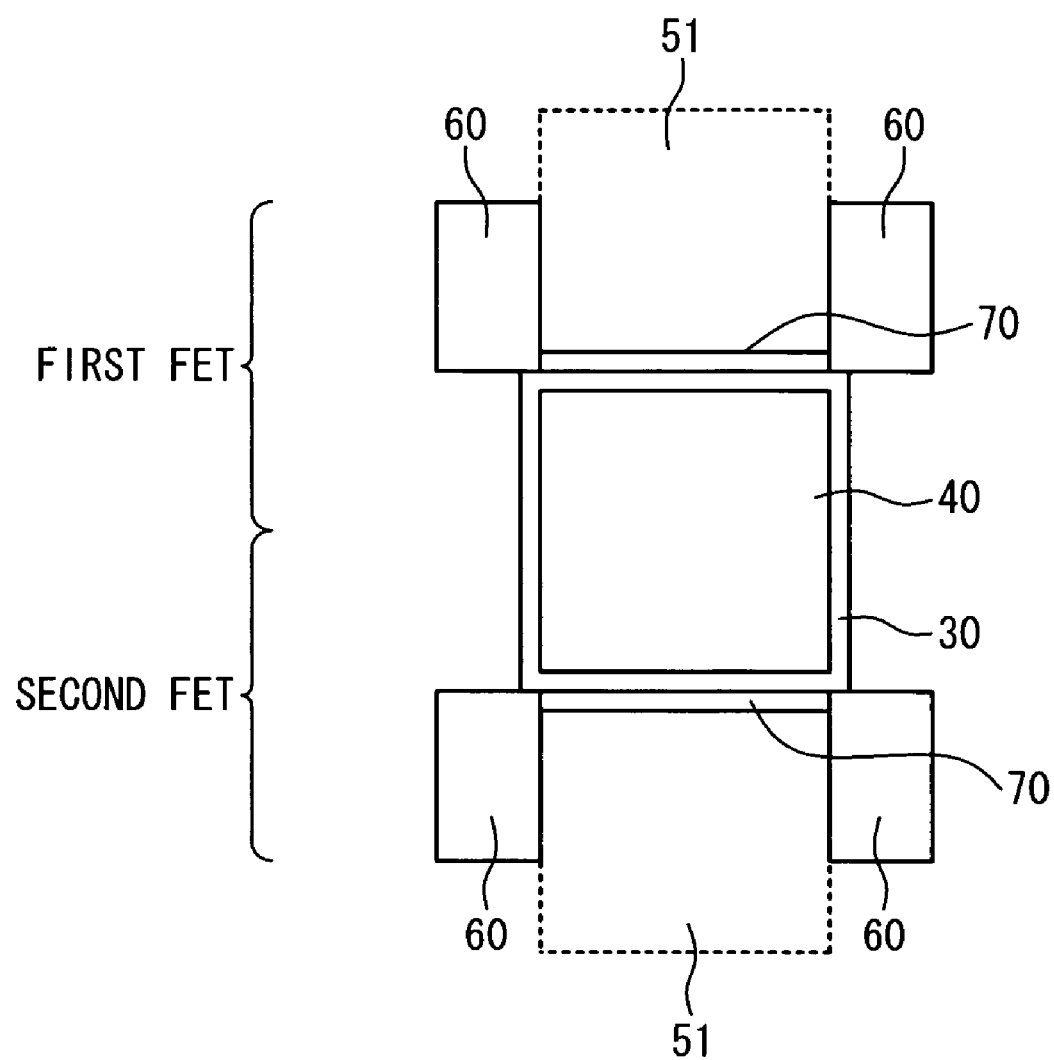
FIG. 9 is a plan view showing a structure of a field-effect transistor according to a sixth embodiment of the present invention.

FIG. 9 is a plan view showing an example in which a plurality of field-effect transistors (FETs) of the present invention are arranged. In the example shown in FIG. 9, two FETs (a first FET and a second FET) are arranged to face each other and sandwich the gate electrode 40. In other words, one gate electrode 40 is shared by the first FET and the second FET. Such the arrangement is possible because the gate electrode 40 according to the present invention has the "buried-gate structure". It should be noted that each of the two FETs has the same structure as described in the above embodiments, and description thereof is appropriately omitted.

Seventh Embodiment

Figure 10:
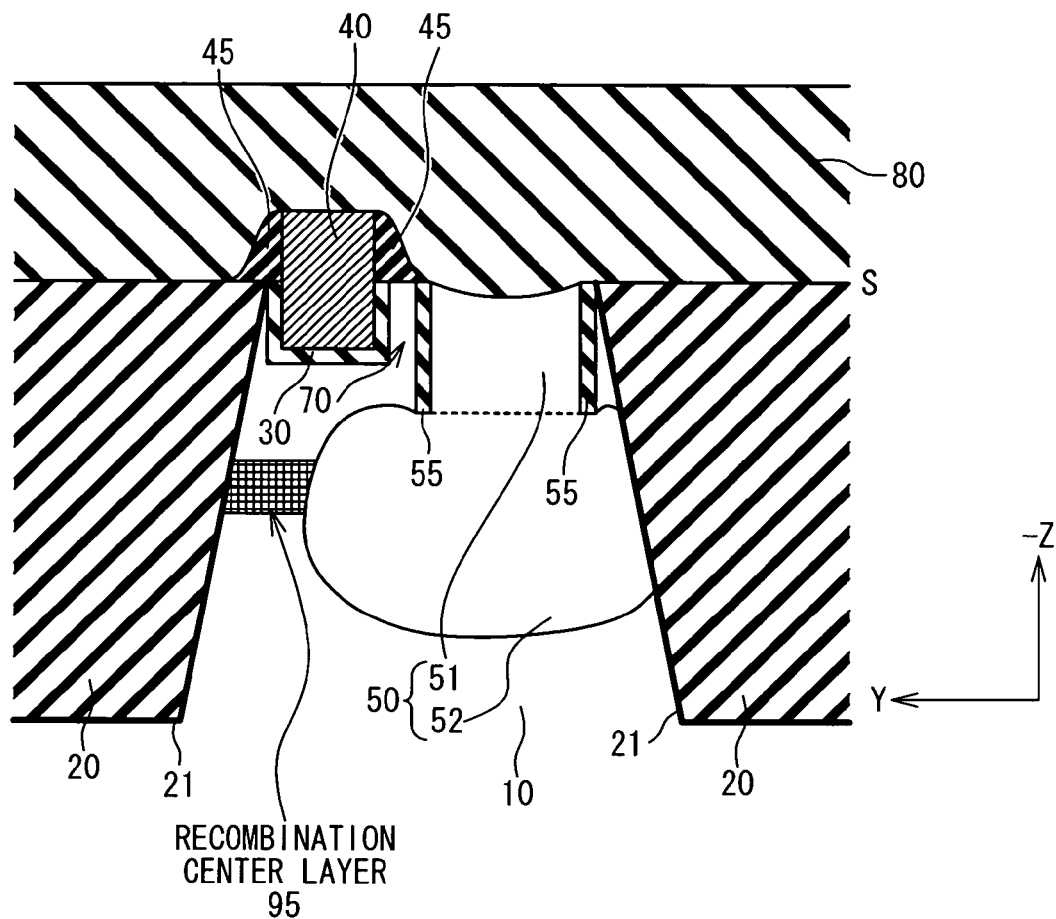
FIG. 10 is a cross sectional view showing a structure of a field-effect transistor according to a seventh embodiment of the present invention.

FIG. 10 is a cross sectional view showing a structure of a field-effect transistor according to a seventh embodiment of the present invention. FIG. 10 is a figure corresponding to FIG. 3A mentioned above, and shows a structure in the YZ-plane. In FIG. 10, the same reference numeral as that in FIG. 3A is given to the same structure as that in FIG. 3A, and description thereof is appropriately omitted.

According to the present embodiment, a recombination center layer 95 is formed in a region that corresponds to the above-mentioned path 90. In other words, the recombination center layer 95 is formed in the region between the second cavity 52 and the STI 20 under the gate electrode 40. The recombination center layer 95 is formed by generating minute defects through implantation of impurity ions. Since the minute defects function as a recombination center, recombination of minority carriers generated by the radiation is facilitated. Therefore, lifetime of the carriers is shortened. That is to say, occurrence of the soft errors is further suppressed and the SER is further improved.

Eighth Embodiment

Figure 11:
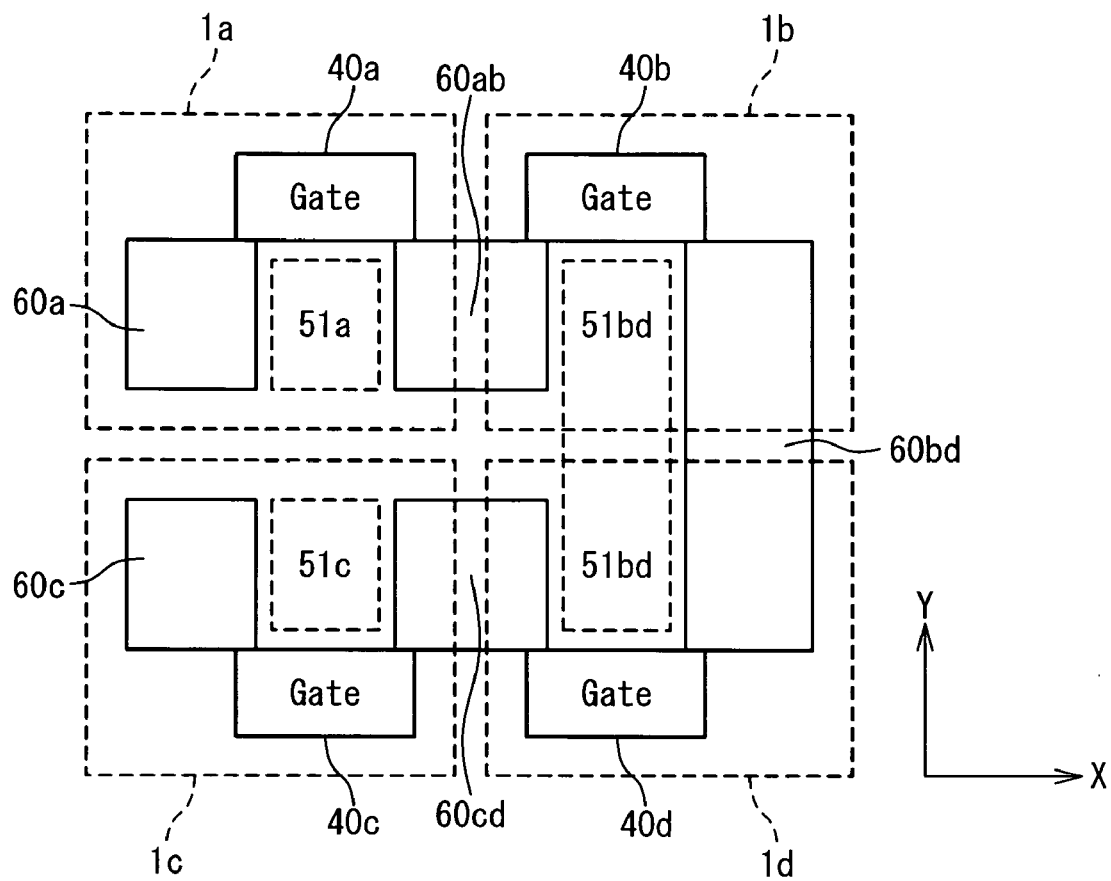
FIG. 11 is a plan view showing a structure of a semiconductor device according to an eighth embodiment of the present invention.

Various semiconductor devices can be manufactured by using the field-effect transistor 1 shown in the first to seventh embodiments described above. FIG. 11 is a plan view (XY-plane) showing a structure of a semiconductor device 100 according to the present invention. The semiconductor device 100 is provided with a plurality of the above-mentioned field-effect transistors (FETs) 1. For example, the semiconductor device 100 is a gate array or a logic circuit.

In FIG. 11, a FET 1a has a gate electrode 40a, diffusion layers 60a and 60ab, and a first cavity 51a. A FET 1b has a gate electrode 40b, the diffusion layer 60ab, a diffusion layer 60bd, and a first cavity 51bd. A FET 1c has a gate electrode 40c, diffusion layers 60c and 60cd, and a first cavity 51c. A FET 1d has a gate electrode 40d, the diffusion layers 60bd and 60cd, and the first cavity 51bd. The diffusion layer 60ab is shared by the FET 1a and the FET 1b. Similarly, the diffusion layer 60cd is shared by the FET 1c and the FET 1d. Further, the cavity 51bd is shared by the FET 1b and the FET 1d.

The plurality of the FETs 1a to 1d can have a different gate widths W. By controlling the depth of the trench for forming the gate electrode, it is possible to manufacture the semiconductor device 100 provided with the plurality of FETs 1a to 1d having different gate widths W.

Alternatively, the plurality of FETs 1a to 1d may have the same gate width W. In this case, the diffusion layer 60a (source) of the FET 1a and the diffusion layer 60bd (source) of the FET 1b are connected to a common power supply, for example. The common diffusion layer 60ab functions as a drain. As a result, a "parallel connection" of the FET 1a and the FET 1b can be achieved. Such a configuration corresponds to a field-effect transistor having a gate width of "2 W". Thus, a designer can freely design the connection in accordance with a required circuit.

Further, the diffusion layer 60a of the FET 1a and the diffusion layer 60bd of the FET 1b may be connected to different nodes, for example. The common diffusion layer 60ab functions as a drain and a source. As a result, a "serial connection" of the FET 1a and the FET 1b can be achieved. As described above, it is possible to freely realize the serial connection, the parallel connection, and a combinational connection of the serial and the parallel connections.

Figure 12:
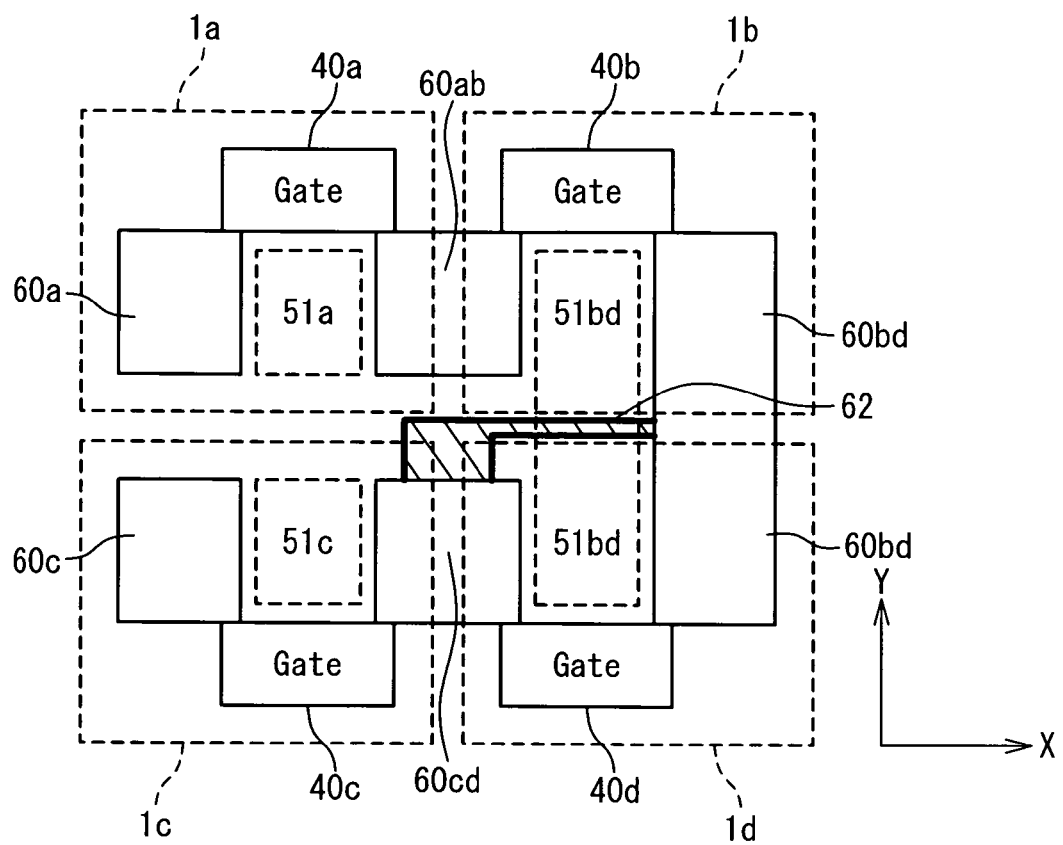
FIG. 12 is a plan view showing another structure of the semiconductor device according to the eighth embodiment of the present invention.

FIG. 12 shows another example of the semiconductor device 100. In FIG. 12, a bridge-shape diffusion layer 62 connecting the diffusion layers 60bd and 60cd is formed in an upper layer of a device isolation region. It is thus possible by providing the bridge-shape diffusion layer 62 to freely design the connection between different diffusion layers. It is also possible to cross or stack other upper interconnections by further insulating an upper layer of the bridge-shape diffusion layer 62.

According to the present embodiment as described above, a semiconductor device is provided in which the SER is reduced. Also, a semiconductor device can be obtained in which the operation speed is improved. Additionally, a semiconductor device with low power consumption can be obtained because of the reduction of the leak current. It is also possible to reduce the area of the semiconductor device.

Ninth Embodiment

Various semiconductor memory devices can be manufactured by using the field-effect transistor 1 shown in the above-mentioned first to seventh embodiments.

Figure 13:
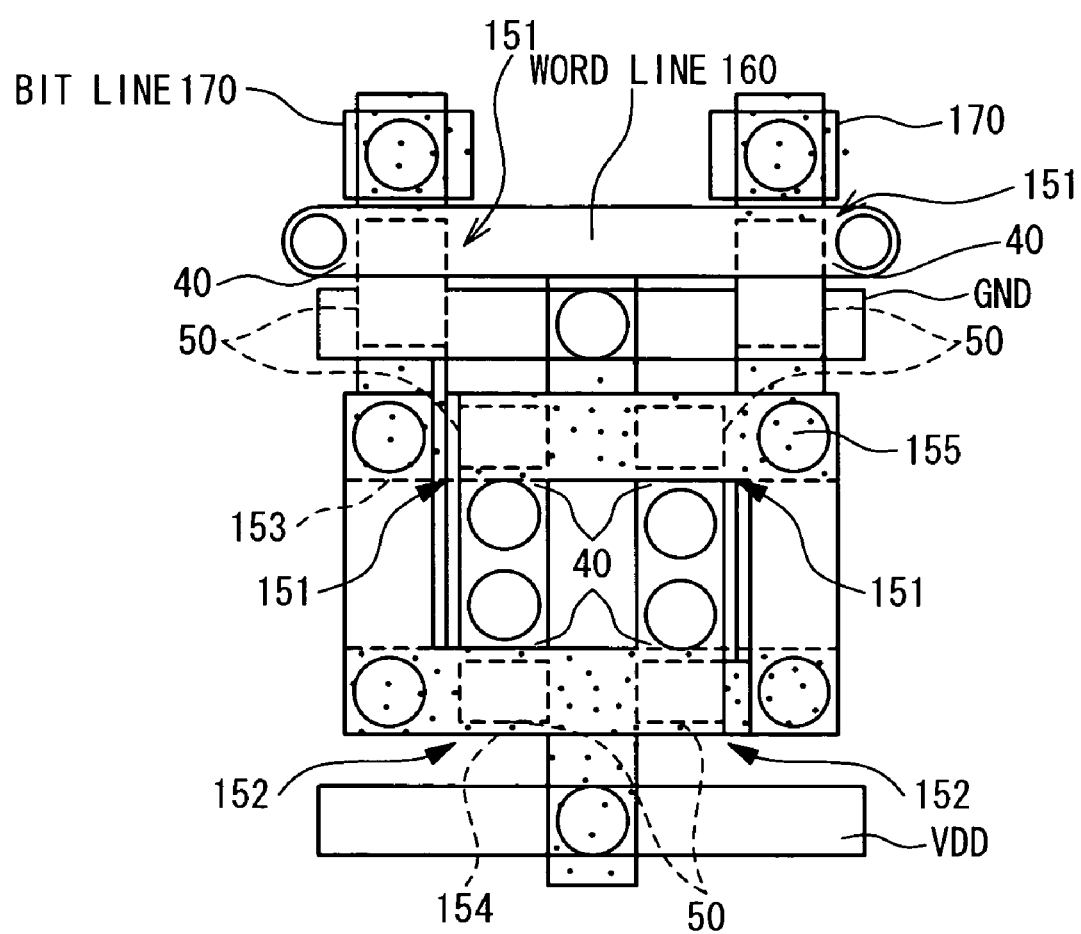
FIG. 13 is a top view showing a structure of an SRAM according a ninth embodiment to the present invention.

FIG. 13 is a top view showing interconnections of an SRAM (Static Random Access Memory) 150 in which one memory cell is constituted by six transistors according to the present invention. In the SRAM 150, the one memory cell has four NMOSs 151 and two PMOSs 152. The field-effect transistor 1 shown in the foregoing embodiments is used as the NMOS 151 and the PMOS 152. That is, each of the NMOS 151 and the PMOS 152 includes the gate electrode 40 having the buried structure and the cavity 50. As shown in FIG. 13, an N-type diffusion layer 153 is formed as the diffusion layer 60 with regard to the NMOS 151, while a P-type diffusion layer 154 is formed as the diffusion layer 60 with regard to the PMOS 152. A contact 155 is provided at a predetermined position.

Gates, sources and drains of the MOS transistors are connected to establish a well-known SRAM configuration. It should be noted that since the gate electrode 40 is buried into the substrate and the cavity 50 is formed in the device region, a common gate electrode (word line) can not be shared by two NMOSs 151 (select transistors) connected to a bit line 170. For this reason, according to the present embodiment, a word line 160 is formed in an upper layer and the gate electrodes 40 of the two NMOSs 151 (select transistors) are connected to the word line 160 through the contact 155, as shown in FIG. 13. By using such NMOSs 151, PMOSs 152 and interconnections, the SRAM 150 with a low SER and a reduced area can be achieved.

Figure 14:
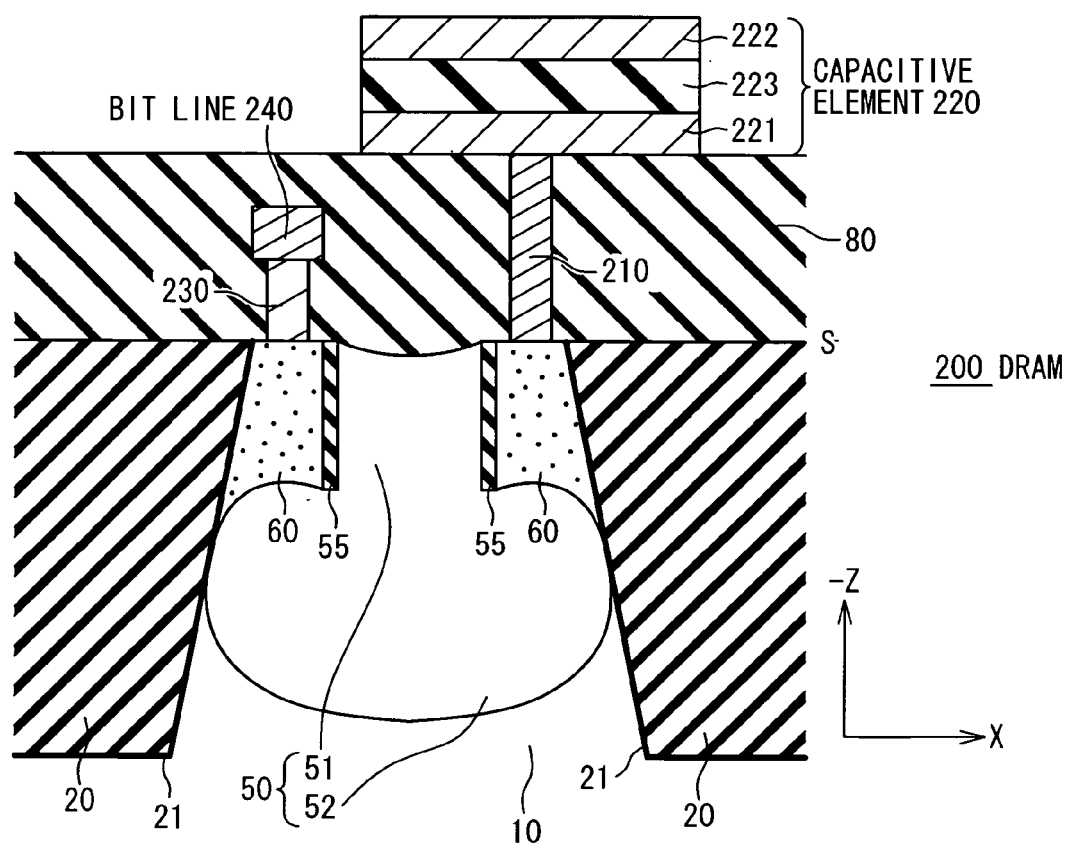
FIG. 14 is a cross sectional view showing a structure of a DRAM according to the ninth embodiment of the present invention.

FIG. 14 is a cross sectional view showing a structure of a DRAM (Dynamic Random Access Memory) 200 according to the present embodiment. FIG. 14 is a figure corresponding to FIG. 3B mentioned above, and shows a structure in the XZ-plane. In FIG. 14, the same reference numeral as that in FIG. 3B is given the same structure as that in FIG. 3B, and description thereof is appropriately omitted. A memory cell of the DRAM 200 includes the field-effect transistor 1 of the present invention. A capacitive element 220 is connected to one diffusion layer 60 through a contact 210. The capacitive element 220 has a lower electrode 221, an upper electrode 222, and a dielectric film 223 sandwiched by the electrodes 221 and 222. On the other hand, a bit line 240 is connected to the other diffusion layer 60 through a contact 230. By arranging the plural memory cells having such structures in an array form, the DRAM 200 with a low SER and a reduced area can be achieved.

Figure 15A:
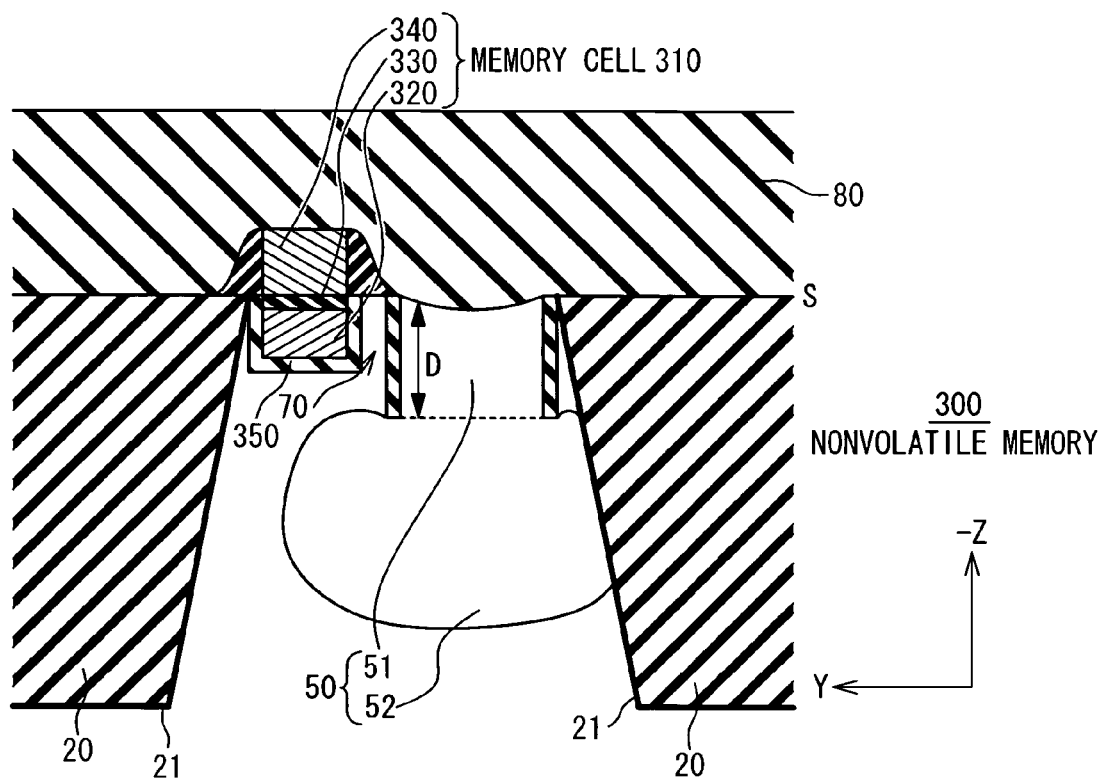
FIG. 15A is a cross sectional view showing a structure of a nonvolatile memory according to the ninth embodiment of the present invention.
Figure 15B:
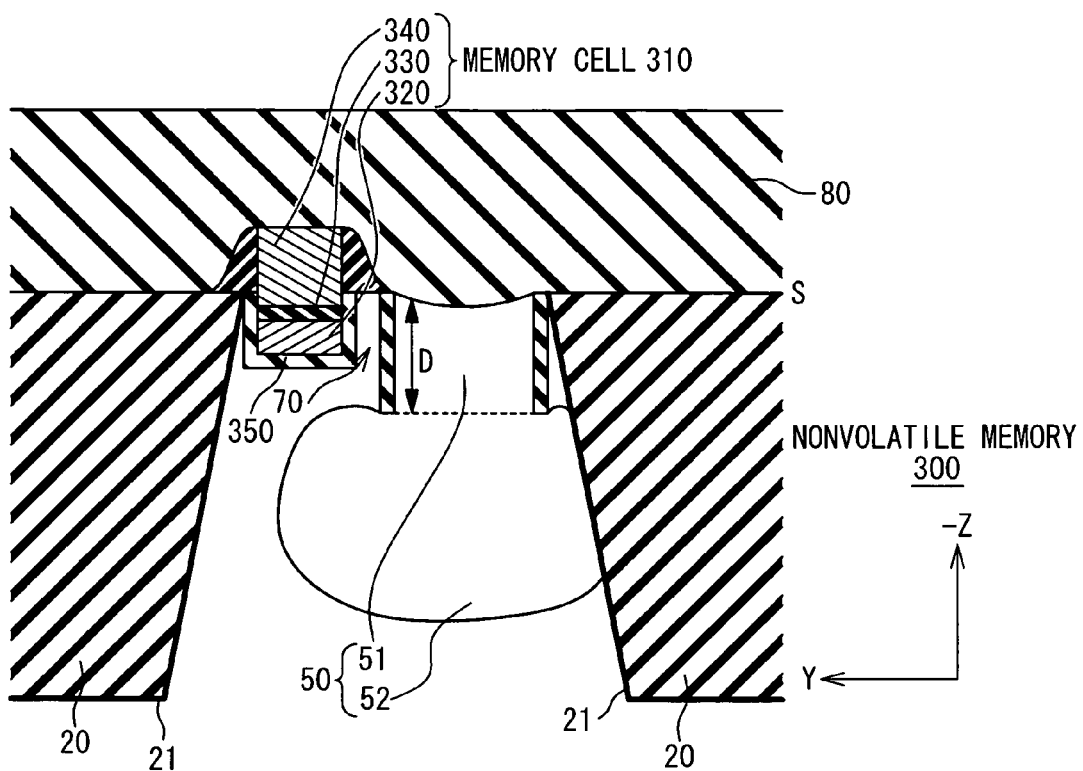
FIG. 15B is a cross sectional view showing another structure of the nonvolatile memory according to the ninth embodiment.

Moreover, FIGS. 15A and 15B are cross sectional views showing structures of nonvolatile semiconductor memory devices 300 (e.g. flash memory) according to the present embodiment. FIGS. 15A and 15B are figures corresponding to FIG. 3A mentioned above, and show structures in the YZ-plane. In FIGS. 15A and 15B, the same reference numeral as that in FIG. 3A is given to the same structure as that in FIG. 3A, and description thereof is appropriately omitted.

According to the nonvolatile semiconductor memory device 300, the gate electrode 40 has a stacked-structure. More specifically, the nonvolatile semiconductor memory device 300 is provided with a floating gate 320 and a control gate 340 which are stacked in order, and a gate insulating film 330 is provided between the floating gate 320 and the control gate 340. According to the nonvolatile semiconductor memory device 300, the gate insulating film 30 in the foregoing embodiments is a tunnel insulating film 350. With such a structure, a nonvolatile memory cell 310 is configured.

In FIG. 15A, the floating gate 320 is buried in the substrate and is located below the substrate surface S. The gate insulating film 330 is formed to substantially align with the substrate surface S. The control gate 340 projects upward from the substrate surface S. In FIG. 15B, not only the floating gate 320 but also a part of the control gate 340 is buried downward from the substrate surface S. By using such the nonvolatile memory cell 310, the nonvolatile semiconductor memory device 300 with a low SER and a reduced are can be achieved.

According to the present embodiment, as described above, a semiconductor memory device is provided in which the SER is reduced. Also, a semiconductor memory device can be obtained in which the operation speed is improved. Additionally, a semiconductor memory device with low power consumption can be obtained because of the reduction of the leak current. It is also possible to reduce the area of the semiconductor memory device.

It is apparent that the present invention is not limited to the above embodiment, and that may be modified and changed without departing from the scope and spirit of the invention.

What is claimed is:

1. A field-effect transistor comprising:
   a semiconductor substrate having a first cavity, the first cavity being hollow;
   a gate electrode buried in said semiconductor substrate;
   a second cavity which is continuous with said first cavity, the second cavity being hollow; and diffusion layers formed in said semiconductor substrate and being in physical contact with said first cavity and said second cavity so as to be separated from said semiconductor substrate; and a device isolation region formed in said semiconductor substrate and having side surfaces, wherein said gate electrode is formed on one of said side surfaces of said device isolation region, and said diffusion layers are formed on another of said side surfaces of said device isolation region.

2. The field-effect transistor according to claim 1, wherein said first cavity is arranged between said diffusion layers.

3. The field-effect transistor according to claim 1, wherein a bottom of said first cavity is located deeper than a bottom of said gate electrode.

4. The field-effect transistor according to claim 1, wherein said gate electrode projects upward from a surface of said semiconductor substrate, and said projected portion of said gate electrode is surrounded by a sidewall.

5. The field-effect transistor according to claim 1, wherein said first cavity reaches a surface of said substrate.

6. The field-effect transistor according to claim 1, wherein said second cavity extends under said diffusion layers.

7. The field-effect transistor according to claim 6, wherein said device isolation region is exposed to said second cavity under said diffusion regions.

8. The field-effect transistor according to claim 6, wherein the substrate is arranged between a device isolation region and said second cavity under said gate electrode.

9. The field-effect transistor according to claim 7, wherein a side surface of said device isolation region is covered by a thermal oxide film.

10. A semiconductor device comprising:
the field-effect transistor of claim 1.

11. The semiconductor device according to claim 10, further comprising a second field-effect transistor formed on said substrate,
wherein said gate electrode or said diffusion layers are shared by said first field-effect transistor and said second field-effect transistor.

12. The field-effect transistor according to claim 1, further comprising:
a channel region disposed between the diffusion layers and arranged laterally relative to the gate electrode, wherein the channel region, diffusion layers, and gate electrode are all arranged in a same plane parallel to a surface of the substrate.

13. A field-effect transistor comprising:
a semiconductor substrate having a first cavity, the first cavity being hollow;
a gate electrode;
a second cavity which is continuous with said first cavity, the second cavity being hollow; and
diffusion layers as a source and a drain, wherein said gate electrode and said diffusion layers surround said first cavity in a plane parallel to a surface of said semiconductor substrate, wherein said first cavity and said second cavity are arranged so as to separate said diffusion layers from said semiconductor substrate;
said second cavity extends under said diffusion layers; and
wherein a device isolation region is exposed to said second cavity.

14. The field-effect transistor according to claim 13, wherein a bottom of said first cavity is located deeper than a bottom of said gate electrode.

15. The field-effect transistor according to claim 13, wherein said gate electrode projects upward from a surface of said semiconductor substrate, and said projected portion of said gate electrode is surrounded by a sidewall.

16. The field-effect transistor according to claim 13, wherein said plane is defined by a first direction and a second direction which are orthogonal to each other,
wherein said first cavity is sandwiched between said source and said drain in said first direction, and
said gate electrode is located away from said first cavity in said second direction.

17. The field-effect transistor according to claim 13, wherein said diffusion layers are adjacent to said first cavity.

18. The field-effect transistor according to claim 13, wherein said device isolation region physically contacts said second cavity.

19. The field-effect transistor according to claim 13, further comprising:
a channel region disposed between the diffusion layers and arranged laterally relative to the gate electrode, wherein the channel region, diffusion layers, and gate electrode are all arranged in a same plane parallel to a surface of the substrate.

20. The field-effect transistor according to claim 13, wherein said source, said drain and said gate electrode are located in a same direction viewed from said first cavity,
wherein said source and said drain are adjacent to said first cavity and said gate electrode is away from said first cavity.

* * * * *